(12) United States Patent
Kim et al.

(10) Patent No.: US 9,006,428 B2
(45) Date of Patent: Apr. 14, 2015

(54) HIGH TRANSMISSIONAL GREEN DYE FOR LCD AND SYNTHETIC METHOD THEREOF

(71) Applicants: LG Display Co., Ltd., Seoul (KR); Seoul National University R&DB Foundation, Seoul (KR)

(72) Inventors: YoungHoon Kim, Goyang-si (KR); JiChul Lim, Pyeongtaek-si (KR); ByungGun Ahn, Paju-si (KR); SangHun Han, Gunpo-si (KR); JaePil Kim, Seoul (KR); SeHun Kim, Seoul (KR); Jun Choi, Seoul (KR); JinWoong Namgoong, Seoul (KR)

(73) Assignees: LG Display Co., Ltd., Seoul (KR); Seoul National University R&DB Foundation, Seoul (KR)

( * ) Notice: Subject to any disclaimer, the term of this patent is extended or adjusted under 35 U.S.C. 154(b) by 0 days.

(21) Appl. No.: 13/731,566

(22) Filed: Dec. 31, 2012

(65) Prior Publication Data

US 2014/0114077 A1  Apr. 24, 2014

(30) Foreign Application Priority Data

Sep. 17, 2012 (KR) .................. 10-2012-0102943

(51) Int. Cl.
| | | |
|---|---|---|
| *C07F 3/06* | (2006.01) | |
| *C07F 1/08* | (2006.01) | |
| *C09B 47/04* | (2006.01) | |
| *C09B 47/067* | (2006.01) | |
| *G02F 1/1335* | (2006.01) | |
| *G03F 7/00* | (2006.01) | |
| *G02B 5/22* | (2006.01) | |

(52) U.S. Cl.
CPC ............... *C09B 47/04* (2013.01); *C09B 47/067* (2013.01); *G02F 1/1335* (2013.01); *C09B 47/0675* (2013.01); *G03F 7/0007* (2013.01); *G02B 5/223* (2013.01)

(58) Field of Classification Search
CPC ..................................... C07F 3/06; C07F 1/08
USPC ........................................... 548/402; 544/181
See application file for complete search history.

(56) References Cited

FOREIGN PATENT DOCUMENTS

CN       101178540 A      5/2008

OTHER PUBLICATIONS

Taube, et al. Document No. 67:43145, retrieved from CAPLUS; May 12, 1984.*
Jian-Dong Huang et al.; "Tetra-(acetyl piperazine phenoxy) Phthalocyaninato Zinc Complexes and Their Proteins Conjugates: Synthesis, Characterisation and Photodynamic Activities"; Chinese Journal of Inorganic Chemistry; vol. 22 No. 3; Mar. 2006; pp. 435-442.
Jun Choi et al.; "Synthesis and characterization of thermally stable dyes with improved optical properties for dye-based LCD color filters"; New J. Chem.; www.rsc.org/njc; 2012; pp. 812-818.
Woosung Lee et al.; "Synthesis and characterization of solubility enhanced metal-free phthalocyanines . . ."; Dyes and Pigments; Elsevier; 2011; pp. 942-948.

* cited by examiner

*Primary Examiner* — Shawquia Jackson
(74) *Attorney, Agent, or Firm* — Birch, Stewart, Kolasch & Birch, LLP

(57) ABSTRACT

The present invention relates to high transmission green dye for LCD, dye dispersion comprising the dye, coloring composite comprising the dye dispersion, color filter comprising the coloring composite, and synthetic method thereof.

14 Claims, 53 Drawing Sheets

| Dye | Transmittance (%) | | | |
|---|---|---|---|---|
| | $T_{max}$ (nm) | 527nm | 541nm | 550nm |
| GD-3 | 512nm 97.35% | 96.76% | 95.62% | 94.04% |
| GD-4 | 506nm 99.28% | 98.87% | 98.32% | 97.67% |
| GD-1 | 520nm 98.31% | 98.28% | 97.71% | 96.84% |
| GD-2 | 526nm 94.93% | 94.91% | 94.70% | 94.30% |
| GD-7 | 530nm 99.06% | 99.03% | 98.87% | 98.68% |
| GD-8 | 558nm 98.72% | 97.01% | 98.05% | 98.55% |

$5 \times 10^{-6}$ mol/L in PGMEA

HIGH TRANSMISSIONAL GREEN DYE FOR LCD AND SYNTHETIC METHOD THEREOF

RELATED APPLICATION

This application claims the benefit of priority to Korean Patent Application No. 10-2012-0102943, filed on Sep. 17, 2012, which is hereby incorporated by reference for all purposes as if fully set forth herein.

BACKGROUND OF THE INVENTION

1. Field of the Invention

The present invention relates to high transmission green dye for LCD, dye dispersion comprising the dye, coloring composition comprising the dye dispersion, color filter comprising the coloring composition, and synthetic method thereof.

2. Background of the Invention

A color filter used in Liquid Crystal Display (LCD) is used for materialize color images in the Display, which can be prepared through a process consisting of coating pigments on a basic circuit board with various methods, and curing and patterning them. The color filter is one that each of 3 color pixel parts is formed on a transparent circuit board as like a glass. The color filter used in a display device or a solid state image sensor usually has a coloring pattern of the three primary colors comprising Red®, green (G) and Blue (B) and play a role in coloring a light passing through or segregating it to the 3 primary colors. Dyes displaying red, green, and blue consist of fine particles, namely pigments, and these pigments display each of red, green, and blue color by mixing dyes representing similar colors rather than being used independently to obtain a color display property in a desired range.

Recently, technology development of LDC toward larger screen and higher definition has been advanced and its usage has been expanded sharply from a display for laptop computer to a monitor for a desktop computer and television monitor. In these situations, the color filter used in LCD is required to have high color purity. Especially in high definition display making high definition image display possible, it becomes important to satisfy this requirement. A light passing through a color filter is to be colored with the color of each pixel and colors of the lights are synthesized to form a color image. Therefore, a color filter having very high purity pixel is required as certain 3 colors of RGB making it possible.

Besides due to propagation of digital camera and camera equipped mobile phone, demand of solid state image sensors such as CCD image sensor has increased remarkably also. As the color filter is used as a key device of these displays or optical elements, demand on cost reduction as well as demand on high definition of the color filter increases.

Dyes used in the color filter are required to have following properties: Having a desirable light absorption property in color reproduction; having no development of optical faults such as light scattering or color non-uniformity of solid state image sensor causing contrast lowering of LCD or optical density non-uniformity causing coarse sensation; having proper resisting properties such as thermal resistance, light resistance, and damp heat resistance; and being capable of preparation of thin film.

Demands on LCD with high definition, namely improved contrast and color purity increase and it is required for improvement of contrast that the particle size of dyes (organic pigments) in photosensitive resin composition for formation of color filter is further smaller. In addition, it is important also to increase content of dyes (such as organic pigments) against solids of the photosensitive resin composition for improvement of color purity.

Besides, in the recent color filter for solid state image sensors such as CCD, high definition is required further. Therefore, miniaturization of dye is desired to inhibit color non-uniformity by coarse particles of the dye.

Currently, a metal halide phthalocyanine dye or a metal halide phthalocyanine pigment is used generally for forming green pixel. In concrete, dyes or pigments with metal halide phthalocyanine structure where at least 8 halogen atoms per phthalocyanine molecule are combined with benzene ring are used as a green dye constituting the green pixels of color filter.

Although Pigment Green 36 has been used mainly among them, its transmission degree is relatively low, so development of dye for improving that has been progressed. As a result of the development, Pigment Green 58 comprising zinc polyhalide phthalocyanine was developed as a dye for overcoming the demerit of Pigment Green 38 and suggested to be used as a dye for color filter.

The dye or the pigment is required to contain following properties: Having a desirable absorption property in color reproduction; and having good fastness property in its application environment including light resistance, thermal resistance, and resistance to oxidative gas such as ozone. Additionally, when the dye is a pigment, it is substantially insoluble in water or organic solvent and it is necessary to contain following properties: having good fastness resisting chemical; and giving no damage to desirable absorption properties in molecular dispersion even in being used as particles. The requirements may be controlled with strength and weakness of intermolecular interaction and it is difficult to make both of them coexist because they are in trade off relationship.

Under these situations, a technology using a dye instead of a pigment has been suggested. When using a dye instead of a pigment, accomplishment of high resolution is expected by solving problems such as color non-uniformity and coarse sensation in the color filter for solid state image sensor and improvement of optical properties such as contrast or haze is expected in LCD or Organic Light-Emitting Display (OLED).

However, coloring curable composition containing dyes has following problems also:

(1) The dyes in molecular dispersion state have insufficient light resistance and thermal resistance generally compared with the pigments forming molecular aggregates; especially, when forming ITO (Indium tin oxide) film used widely as an electrode of LCD, there is a problem that optical properties are changed by high temperature process.

(2) The dyes in molecular dispersion state have insufficient solvent resistance generally compared with the pigments forming molecular aggregates;

(3) As the pigment tends to inhibit radical polymerization reaction, there are some difficulties in designing coloring curable composition in a system using the radical polymerization as a mean of curing;

(4) Conventional dyes have lower solubility in alkali aqueous solution or organic solvent, so it is difficult to obtain a coloring curable composition having a desired spectrum;

(5) The dyes are likely to interact with other ingredients in the coloring curable composition, so it is difficult to control solubility of exposure and non-exposure part (developing property);

(6) When molar extinction coefficient of the dye ($\epsilon$) is low, it is needed to add large amount of the dye. Thus, it is required to reduce the amount of other ingredients such as polymeric chemical (monomer), binder, or photo-initiator in the coloring curable composition relatively; curing property, heat resistance after curing, and developing property of the composition are lowered.

Therefore, it is required to develop an improved dye used for preparing a color filter for LCD able to overcome the above mentioned disadvantages.

SUMMARY OF THE INVENTION

An object of the present invention is to provide high transmission green dye for LCD, dye dispersion comprising the dye, coloring composition comprising the dye dispersion, color filter comprising the coloring composition, and synthetic method thereof.

In the present invention, it was intended to develop high transmission green dye of color filter for developing hybrid color photo resist proper to low electric power LED BLU light source substituting for CCFL, a conventional LCD color filter backlight (BLU) light source. For this, it is necessary to develop a high transmission major green dye and a high durability yellow compensation dye able to absorb short wavelength in the range of 400~500 nm and it is intended to materialize transmission spectrum for optimal green color filter by mixing the high transmission green dye and the yellow dye appropriately.

An example of the present invention to accomplish the objective is a dye of Formula 1.

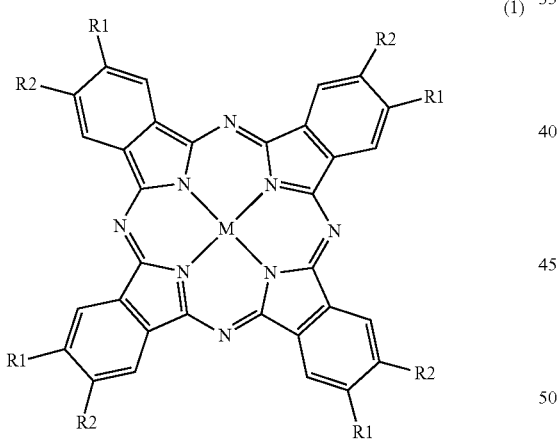

(1)

Wherein, M is Cu or Zn and R1 or R2 is selected from a group consisting of halogen, unsubstituted or substituted alkyl ether, and unsubstituted or substituted aryl ether independently. Provided, the case that the both R1 and R2 are halogen is excluded.

In the present invention, phthalocyanine currently used as a pigment type was used as a main dye of green color filter. The phthalocyanine is clear blue and green, which has good durability (heat resistance, and light resistance) and very high molar extinction coefficient, and is being used as a major blue and green colored pigment type color filter.

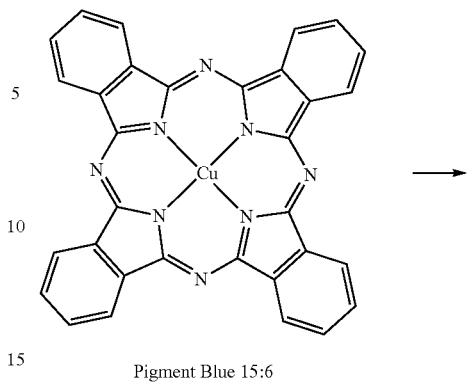

Pigment Blue 15:6

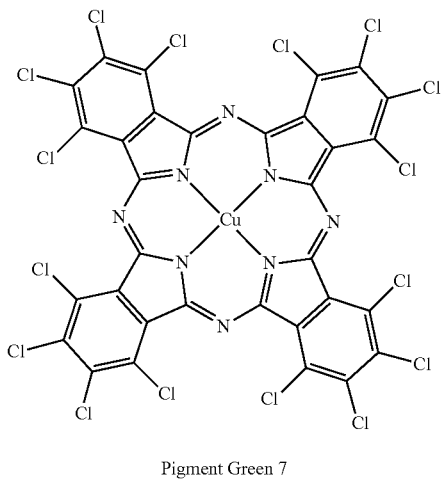

Pigment Green 7

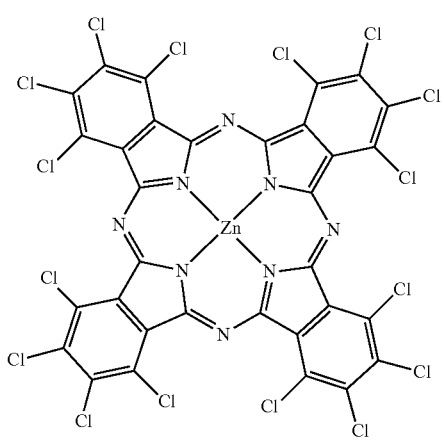

Pigment Green 36

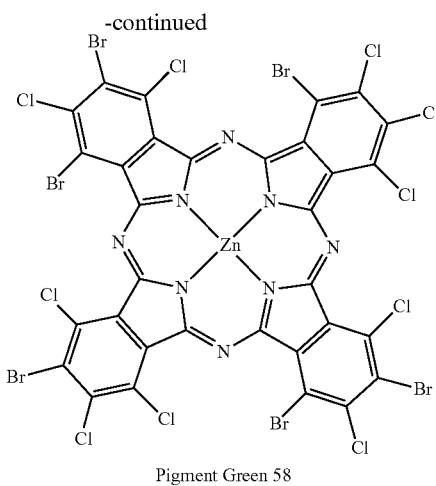

Pigment Green 58

In this study, reduction of durability was minimized and solubility was improved by introducing ether link and bulk sized alkyl/aryl substituent to non-peripheral (α) position and peripheral (β) position of isoindole part of phthalocyanine pigment with good durability and clear color.

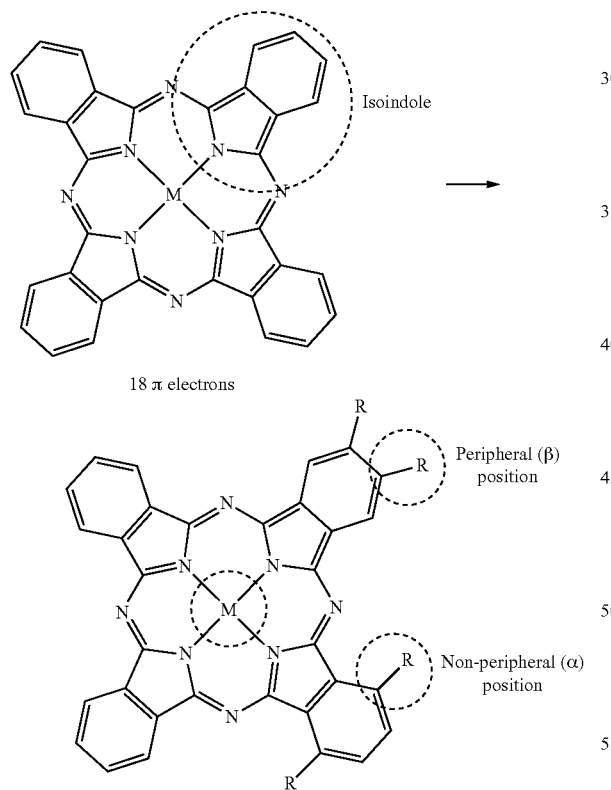

When a substituent is introduced to non-peripheral position of isoindole region of phthalocyanine, the wavelength is shifted toward longer wavelength region more than the case that a substituent is introduced to the peripheral position of isoindole region of phthalocyanine and the solubility is improved also from increase of steric hindrance.

In addition, the wavelength is changed according to the central metal, where from the introduction of metal, the wavelength moves to shorter region than non-metal phthalocyanine and introduction of substituent to the isoindole region induces movement of wavelength toward longer region. Therefore, the color from blue to green is expressed according to proper combination of central metal and substituent.

In a preceding study, when 4 substituents were introduced into the peripheral position of isoindole, the color was expresses as green, but its absorption and transmission spectrum features was insufficient somewhat. Accordingly, in this study, it was attempted to move the wavelength further toward longer region than the conventional dye where 4 substituents were introduced by introducing 8 substituents to the peripheral position of isoindole region. Another example of the present invention is to introduce 8 identical bulk-sized substituents to the isoindole region.

Another example of the present invention is to raise the solubility and attempt to make the wavelength longer through hybrid structure of pigment and dye through mixing of them by introducing halogen atom to one side of isoindole and bulk sized substituent to the other side of isoindole.

As substitution at non-peripheral position brings more shift toward longer wavelength than the substitution at peripheral position, it was attempted to improve solubility and bring proper shift toward longer wavelength to green color through introduction of 8 substituents with similar structure for compatibility with the solvent, PGMEA (Propylene Glycol Monomethyl Ether Acetate), minimizing shift toward longer wavelength by minimizing electron donating strength (EDS).

The unsubstituted or substituted alkyl ether may have more than 6 carbon atoms and the unsubstituted or substituted aryl ether may have more than 6 carbon atoms.

The R1 and R2 may be one selected from a group consisting of halogen,

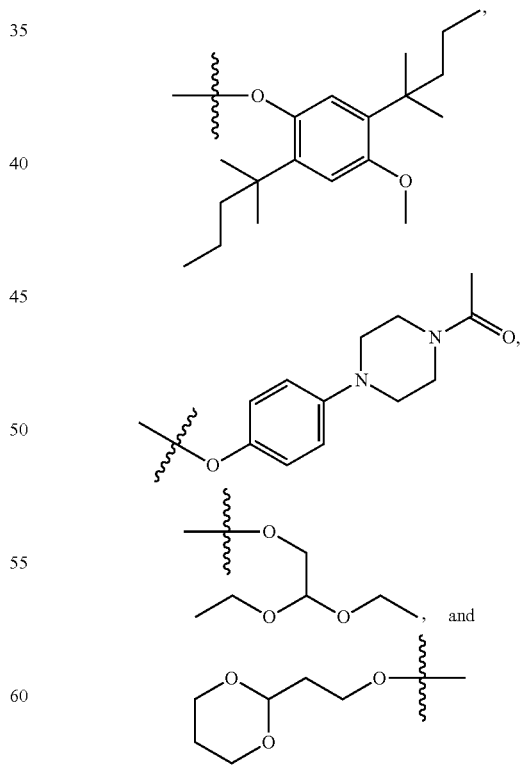

independently. Provided, the case that the both R1 and R2 are halogen is excluded.

In another example of the present invention, a mimetic diagram of dye synthesis reaction is as follows.

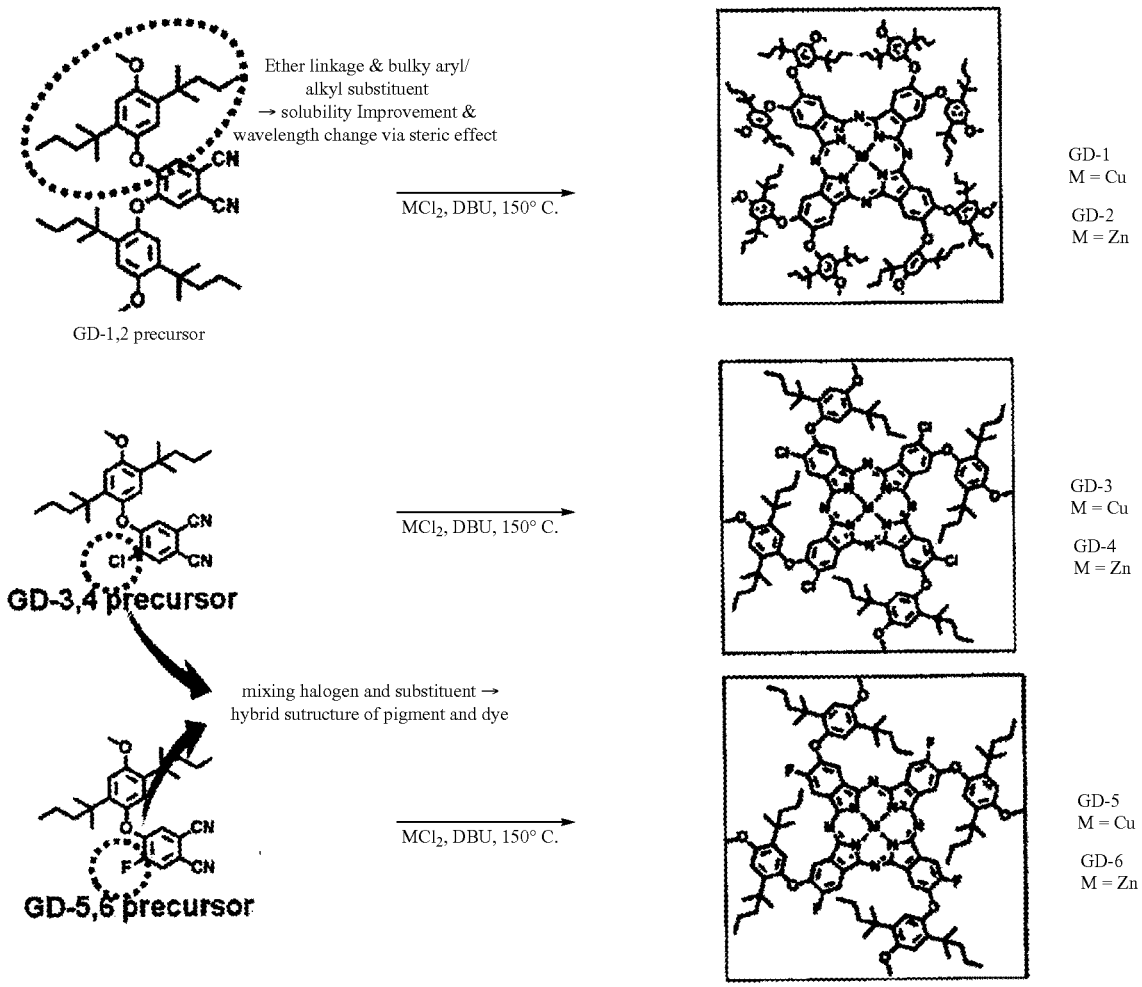

Another example of the present invention to accomplish the objective is a dye of Formula 2.

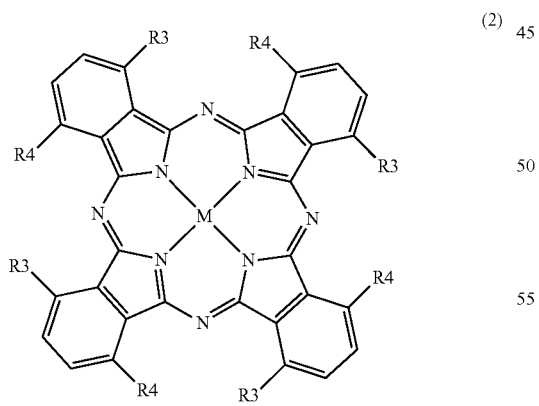

Wherein, M is Cu or Zn and R3 or R4 is selected from a group consisting of hydrogen, unsubstituted or substituted alkyl ether, and unsubstituted or substituted aryl ether, independently. Provided, the case that the both R3 and R4 are hydrogen is excluded.

The unsubstituted or substituted alkyl ether may have more than 6 carbon atoms and the unsubstituted or substituted aryl ether may have more than 6 carbon atoms.

The R3 or R4 may be one selected from a group consisting of hydrogen,

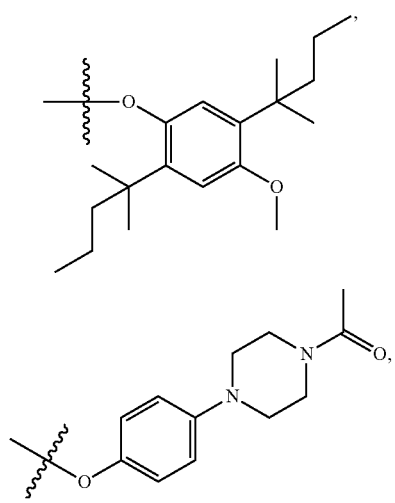

-continued

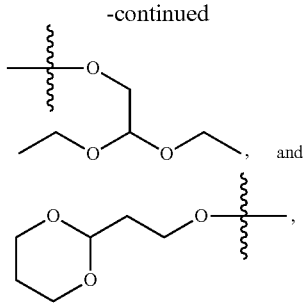

and independently. Provided, the case that the both R3 and R4 are hydrogen is excluded.

In another example of the present invention, a mimetic diagram of dye synthesis reaction is as follows.

Another example of the present invention to accomplish the objective is a dye dispersion comprising the said dye.

Another example of the present invention to accomplish the objective is a coloring composition comprising the said dye dispersion.

Another example of the present invention to accomplish the objective is a color filter formed by using the said coloring composition.

Another example of the present invention to accomplish the objective is a synthetic method of the said dye comprising: a step to synthesize a phthalonitrile-induced precursor; and a step to synthesize the dye of Formula 1 using the phthalonitrile-induced precursor.

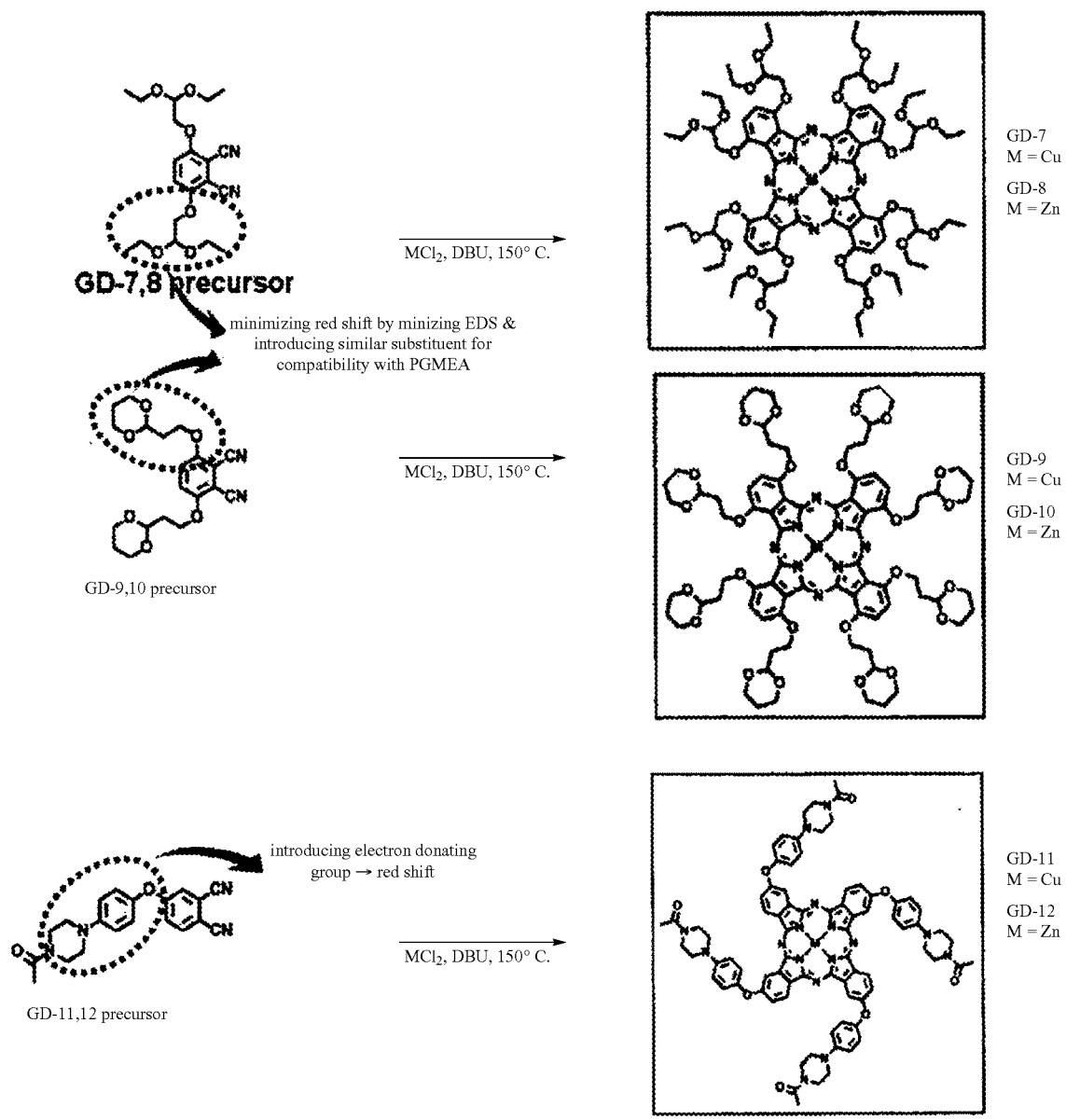

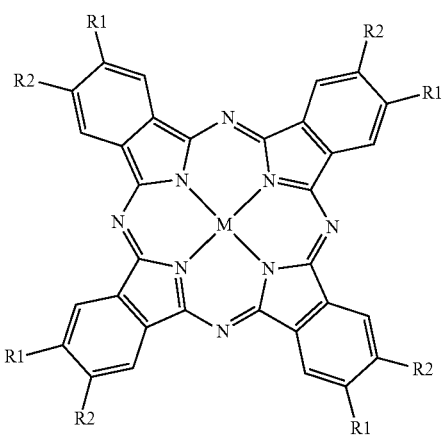

(1)

Wherein, M is Cu or Zn and R1 or R2 is selected from a group consisting of halogen, unsubstituted or substituted alkyl ether, and unsubstituted or substituted aryl ether independently. Provided, the case that the both R1 and R2 are halogen is excluded.

Another example of the present invention to accomplish the objective is a synthetic method of the said dye comprising: a step to synthesize a phthalonitrile-induced precursor; and a step to synthesize the dye of Formula 2 using the phthalonitrile-induced precursor.

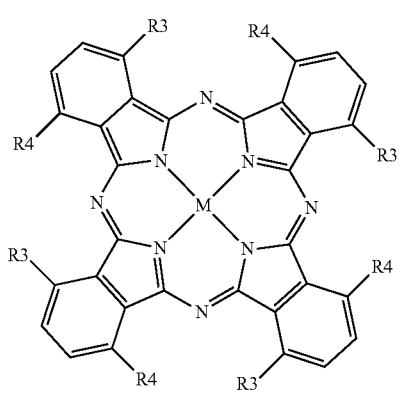

(2)

Wherein, M is Cu or Zn and R3 or R4 is selected from a group consisting of hydrogen, unsubstituted or substituted alkyl ether, and unsubstituted or substituted aryl ether, independently. Provided, the case that the both R3 and R4 are hydrogen is excluded.

Effects of Invention

The present invention can provide a green dye to cope with low electric power type LED BLU light source substitutable conventional CCFL BLU and a green dye with high transmission and high durability for substitution of major pigment. It is possible to an optimal green color filter by mixing with yellow compensation dye with high durability able to absorb the shorter wavelength range effectively. In addition, the dye synthesized in the present invention has high durability (high heat resistance and high thermal resistance) suitable to present LCD process as well as solubility proper to conventional pigment type solvent (PGMEA). In other words, the present invention provides an optimal synthetic method and mass synthesis technology as well as high transmission green dye for LCD.

DETAILED DESCRIPTION OF THE INVENTION

Figure 1:
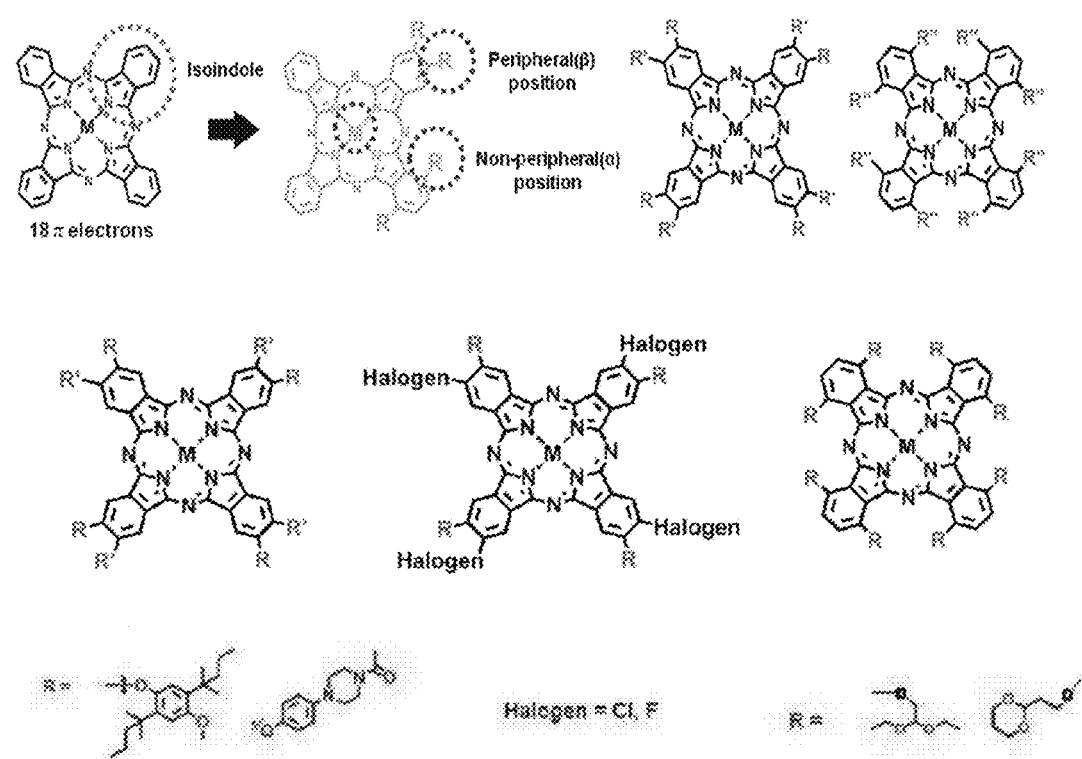
FIG. 1 shows a diagram of the improved dye according to the present invention.

Further scope of applicability of the present application will become more apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from the detailed description.

1. Synthesis of Green Dye (GD)
1-1. Synthesis of Green Dye Precursor
(1) Precursor Synthesis of GD-1,2

Dissolve 1.97 g (10 mmol) of 4,5-dichlorophthalonitrile, 7.31 g (25 mmol) of 4-methoxy-2,5-bis(2-methylpentan-2-yl)phenol, 9.67 g (70 mmol) of $K_2CO_3$ in 70 ml of anhydrous DMF under nitrogen gas and circulate it at 80° C. for 8 hr. After completion of the reaction, drop the reacted solution slowly to ice water. Filter the white powder precipitated in the ice water and then dry it in the oven. The dried product was purified with column chromatography.

(2) Precursor Synthesis of GD-3,4

The precursor synthesis of GD-3,4 was performed using same method of the precursor synthesis of GD-1,2 other than dissolving 1.97 g (10 mmol) of 4,5-dichlorophthalonitrile, 2.92 g (10 mmol) of 4-methoxy-2,5-bis(2-methylpentan-2-yl)phenol, and 6.91 g (50 mmol) of $K_2CO_3$ in 70 ml of anhydrous DMF.

(3) Precursor Synthesis of GD-5,6

The precursor synthesis of GD-5,6 was performed using same method of the precursor synthesis of GD-1,2 other than dissolving 1.64 g (10 mmol) of 4,5-difluorophthalonitrile, 2.92 g (10 mmol) of 4-methoxy-2,5-bis(2-methylpentan-2-yl)phenol, and 6.91 g (50 mmol) of $K_2CO_3$ in 70 ml of anhydrous DMF.

(4) Precursor Synthesis of GD-7,8

Dissolve 3.20 g (20 mmol) of 2.3-dicyanohydroquinone, 11.82 g (60 mmol) of 2-bromo-1.1-diethoxyethanel, 11.82 g (60 mmol) of $K_2CO_3$ in 70 ml of anhydrous DMF under nitrogen gas and circulate it at 100° C. for 8 hr. After completion of the reaction, drop the reacted solution slowly to ice water. Filter the white powder precipitated in the ice water and then dry it in the oven. The dried product was purified with column chromatography.

(5) Precursor Synthesis of GD-9,10

The precursor synthesis of GD-9,10 was performed using same method of the precursor synthesis of GD-7,8 other than dissolving 3.20 g (20 mmol) of 2.3-dicyanohydroquinone, 11.70 g (60 mmol) of 2-(2-bromoethyl)-1.3-dioxane and 13.82 g (100 mmol) of $K_2CO_3$ in 70 ml of anhydrous DMF under nitrogen gas.

(6) Precursor Synthesis of GD-11,12

The precursor synthesis of GD-11,12 was performed using same method of the precursor synthesis of GD-1,2 other than dissolving 1.73 g (10 mmol) of 4-nitrophthalonitrile, 2.20 g (10 mmol) of 1-acetyl-4-(4-hydroxyphenyl)piperazine, and 6.91 g (50 mmol) of $K_2CO_3$ in 70 ml of anhydrous DMF.

The mimetic diagram of precursor synthesis of the GD-1~12 is as follows.

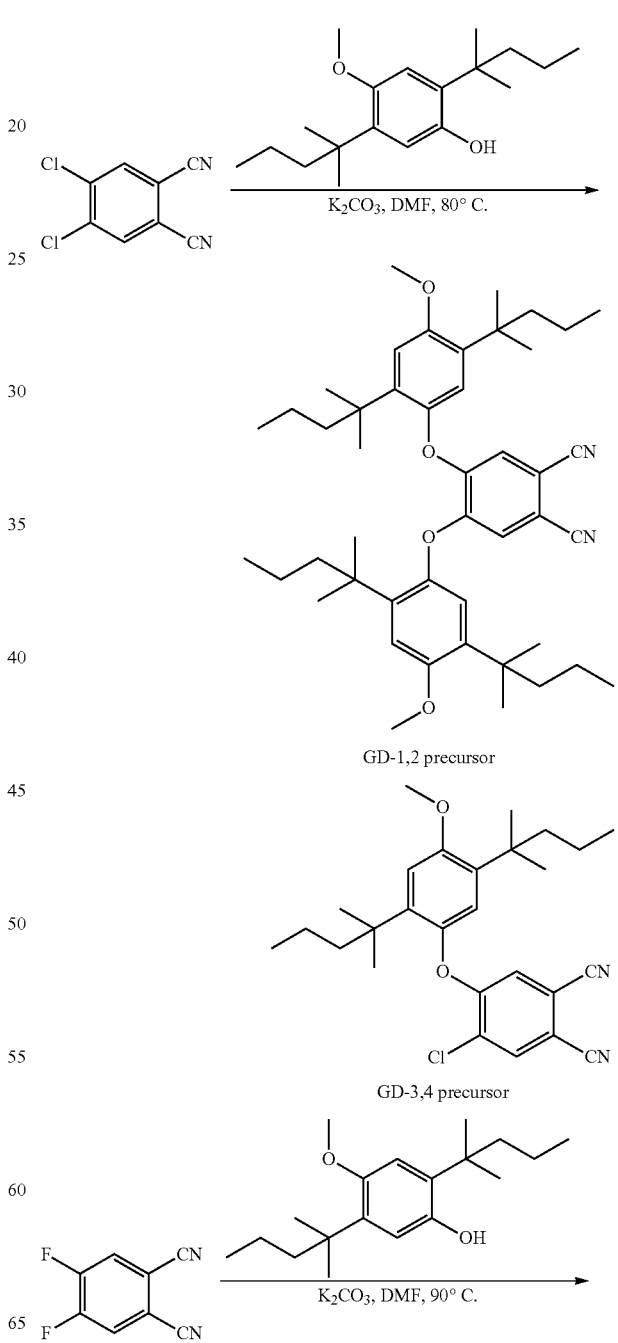

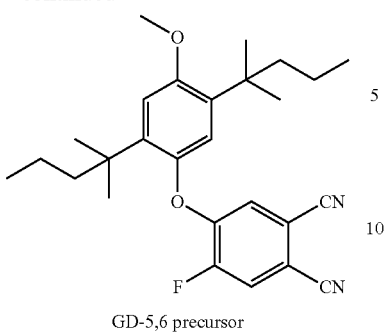

GD-5,6 precursor

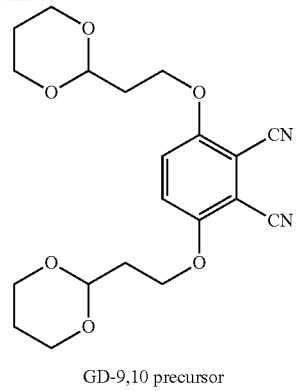 [SMILES: N#Cc1c(OCCC2OCCCO2)ccc(OCCC2OCCCO2)c1C#N]

GD-9,10 precursor

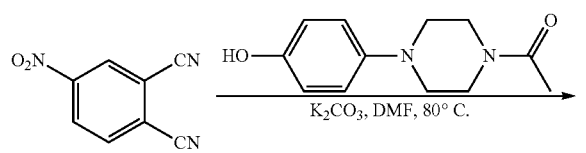

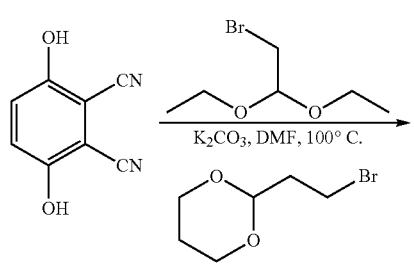

GD-11,12 precursor

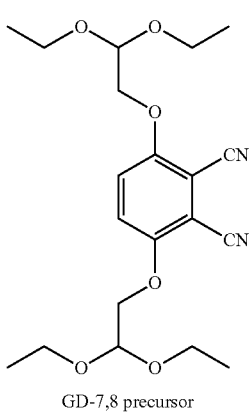

GD-7,8 precursor 1-2. Synthesis of Green Dye (1) Synthesis of GD-1

Dissolve 1.42 g (2 mmol) of the GD-1 precursor synthesized in the example 1-1, 1.50 ml (10 mmol) of DBU (1,8-diazabicycle[5.4.0]-7-undecene), and 0.27 g (2 mmol) of $CuCl_2$ in 50 ml of 1-pentanol under nitrogen gas and circulate at 150° C. for 12 hr. After completion of the reaction, the solvent was removed under reduced pressure. Dissolve the remaining product in MC (methylene chloride) and extract it with water several times. After removing MC under reduced pressure, the product was filtered through methanol recycling. Dry the green powder remained on the filter paper in the oven and purity it with column chromatography.

(2) Synthesis of GD-2

Dissolve 1.42 g (2 mmol) of the GD-2 precursor synthesized in the example 1-1, 1.50 ml (10 mmol) of DBU (1,8-diazabicycle[5.4.0]-7-undecene), and 0.27 g (2 mmol) of $ZnCl_2$ in 50 ml of 1-pentanol under nitrogen gas and circulate at 150° C. for 12 hr. After completion of the reaction, the solvent was removed under reduced pressure. Dissolve the remaining product in MC (methylene chloride) and extract it with water several times. After removing MC under reduced pressure, the product was filtered through methanol recycling. Dry the green powder remained on the filter paper in the oven and purity it with column chromatography.

(3) Synthesis of GD-3

GD-3 was synthesized and purified with same method and same molar equivalent to the synthesis of GD-1 excluding using GD-3 precursor synthesized in the example 1-1 as precursor.

(4) Synthesis of GD-4

GD-4 was synthesized and purified with same method and same molar equivalent to the synthesis of GD-1 excluding using GD-4 precursor synthesized in the example 1-1 as precursor.

(5) Synthesis of GD-5

GD-5 was synthesized and purified with same method and same molar equivalent to the synthesis of GD-1 excluding using GD-5 precursor synthesized in the example 1-1 as precursor.

(6) Synthesis of GD-6

GD-6 was synthesized and purified with same method and same molar equivalent to the synthesis of GD-1 excluding using GD-6 precursor synthesized in the example 1-1 as precursor.

(7) Synthesis of GD-7

GD-7 was synthesized and purified with same method and same molar equivalent to the synthesis of GD-1 excluding using GD-7 precursor synthesized in the example 1-1 as precursor.

(8) Synthesis of GD-8

GD-8 was synthesized and purified with same method and same molar equivalent to the synthesis of GD-1 excluding using GD-8 precursor synthesized in the example 1-1 as precursor.

(9) Synthesis of GD-9

GD-9 was synthesized and purified with same method and same molar equivalent to the synthesis of GD-1 excluding using GD-9 precursor synthesized in the example 1-1 as precursor.

(10) Synthesis of GD-10

GD-10 was synthesized and purified with same method and same molar equivalent to the synthesis of GD-1 excluding using GD-10 precursor synthesized in the example 1-1 as precursor.

(11) Synthesis of GD-11

GD-11 was synthesized and purified with same method and same molar equivalent to the synthesis of GD-1 excluding using GD-11 precursor synthesized in the example 1-1 as precursor.

(12) Synthesis of GD-12

GD-12 was synthesized and purified with same method and same molar equivalent to the synthesis of GD-1 excluding using GD-12 precursor synthesized in the example 1-2 as precursor.

reduction in the isothermal zone. It is considered that this mass reduction of the dyes may be affected by small amount of impurities.

4. Solubility Analysis of Dye

For organic solvents and process solvents, solubility of the synthesized dyes was assessed. The results were assessed qualitatively and shown in below Table 1. As shown in the Table 1, it was found that overall solubility to the organic solvent ($CH_2Cl_2$) was better than that to the process solvent (PGMEA). It was found that GD-3-6 with dye-pigment hybrid structure showed excellent solubility to PGMEA, from structural diversity from existence of isomers and the results of proper steric hindrance by substituents. As in general, a dye has a physical property that its solubility is better than that of a pigment and in case of the present invention, when granting steric hindrance to green pigment to make it have a certain solubility, the pigment becomes a dye, the above mentioned term of dye-pigment hybrid structure means that the solubility was improved by granting steric hindrance from introducing bulk-sized substituents to common pigment. These results show that it is possible to accomplish excellent solubility through control on the introduction of substituents able to induce proper steric hindrance to prevent aggregation between dyes and crystallization of the dye.

TABLE 1

|  | GD-1 | GD-2 | GD-3 | GD-4 | GD-5 | GD-6 | GD-7 | GD-8 | GD-9 | GD-10 | GD-11 | GD-12 |
| --- | --- | --- | --- | --- | --- | --- | --- | --- | --- | --- | --- | --- |
| $CH_2Cl_2$ | +++ | +++ | +++ | +++ | +++ | +++ | + | + | + | + | ++ | ++ |
| PGMEA | ++ | ++ | +++ | +++ | +++ | +++ | + | + | + | + | + | + |

Figure 2A:
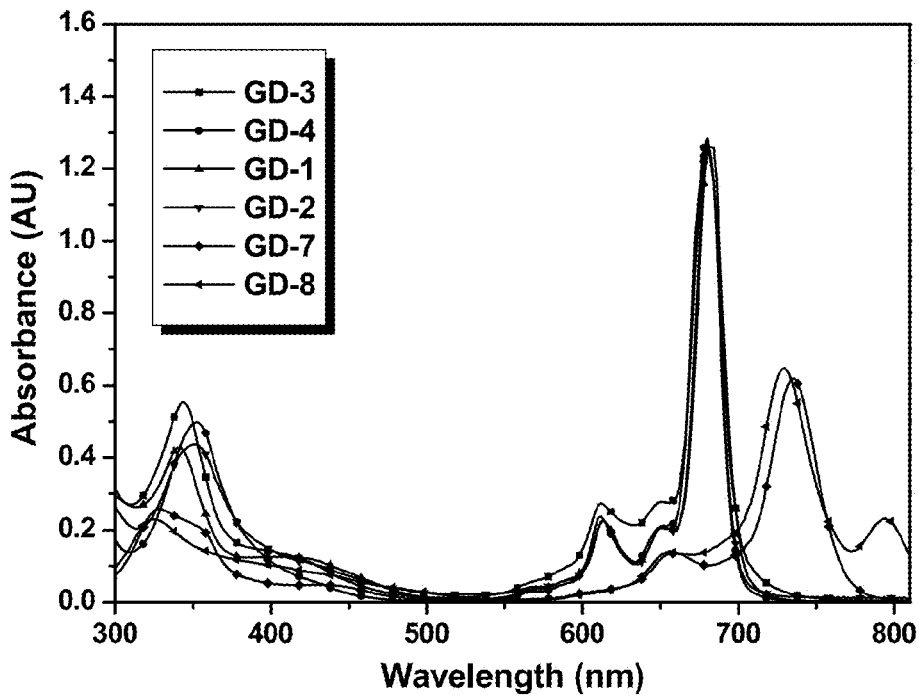
FIG. 2A shows UV-VIS absorption of the synthesized dyes.
Figure 2B:
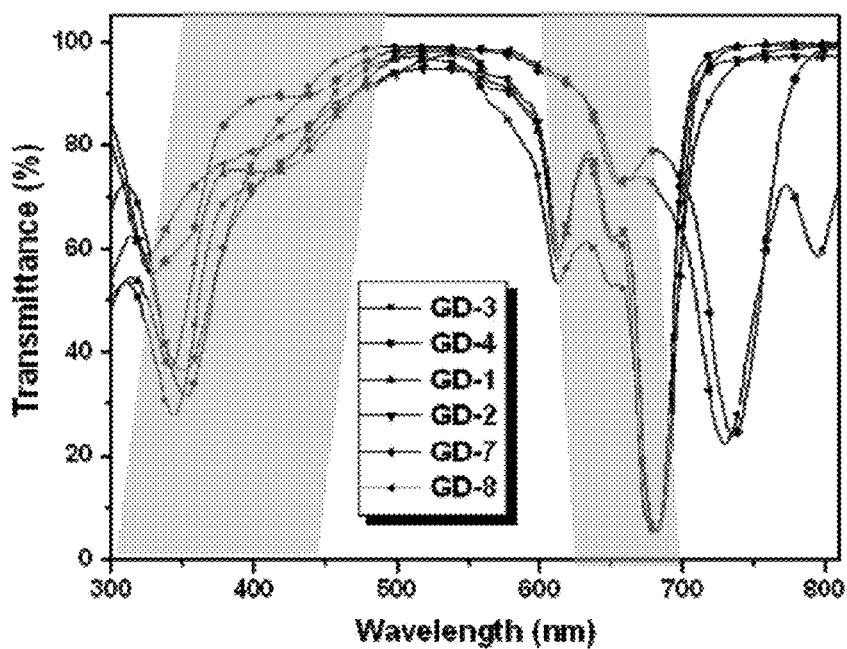
FIG. 2B shows transmission spectrum of the synthesized dyes.
Figure 3A:
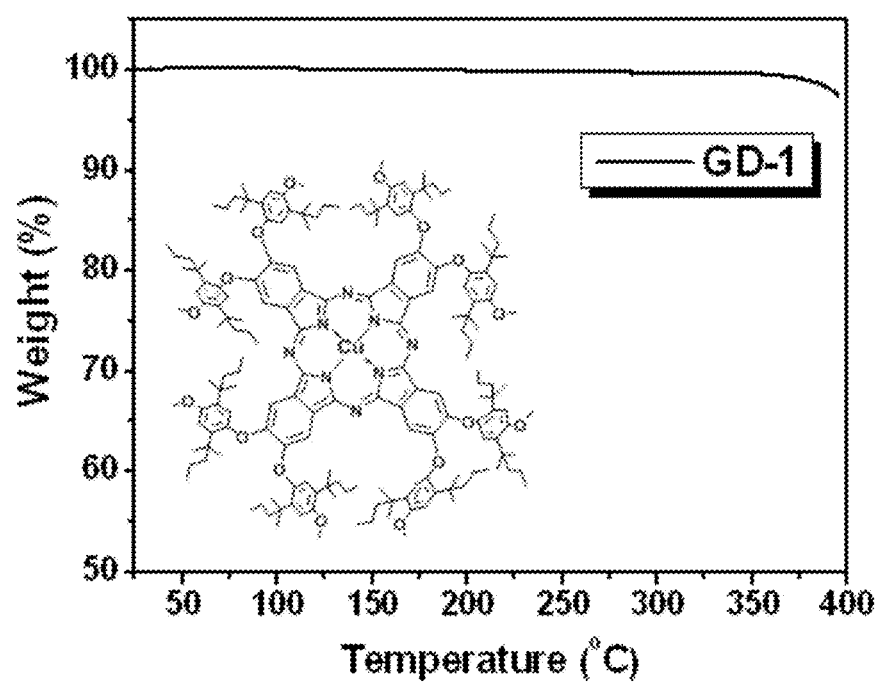
FIGS. 3A-3H are graphs showing thermal resistances of the synthesized dyes.
Figure 3B:
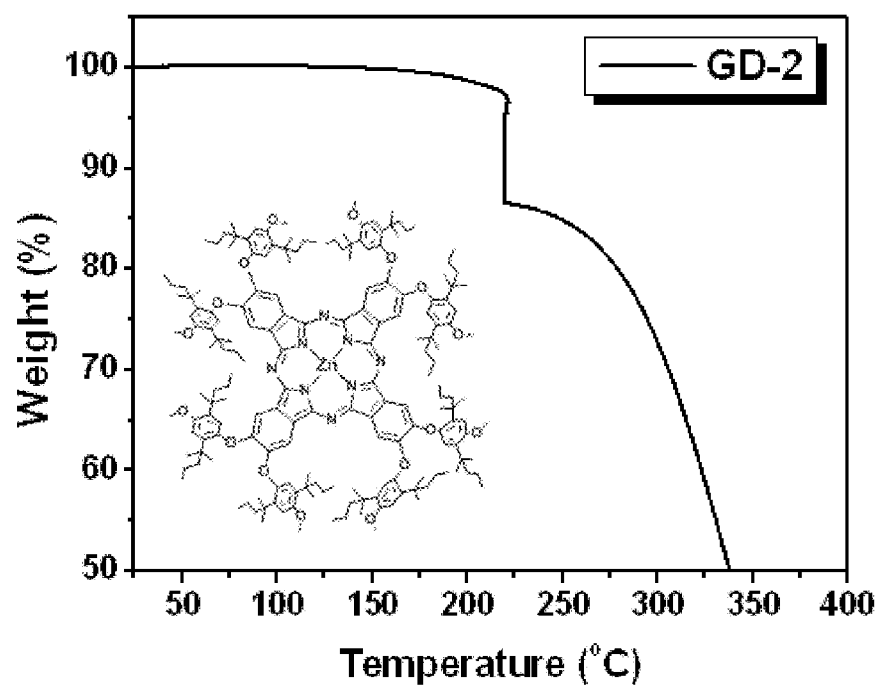
Figure 3C:
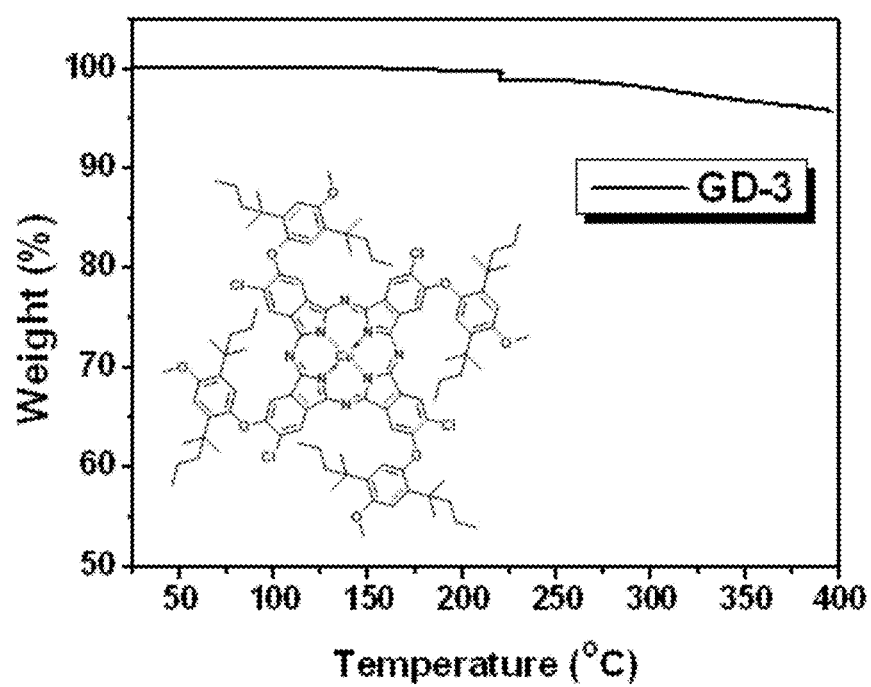
Figure 3D:
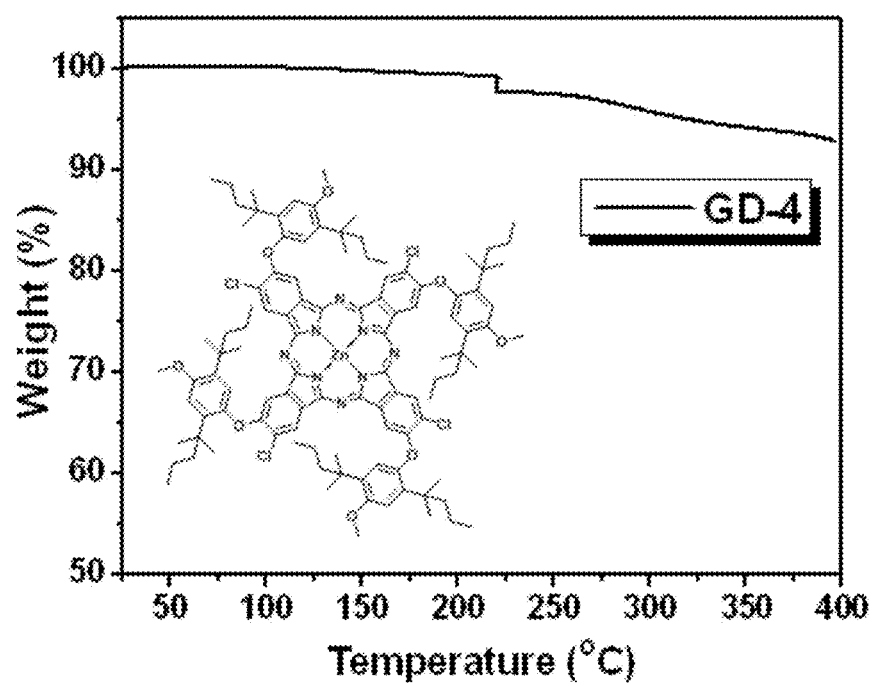
Figure 3E:
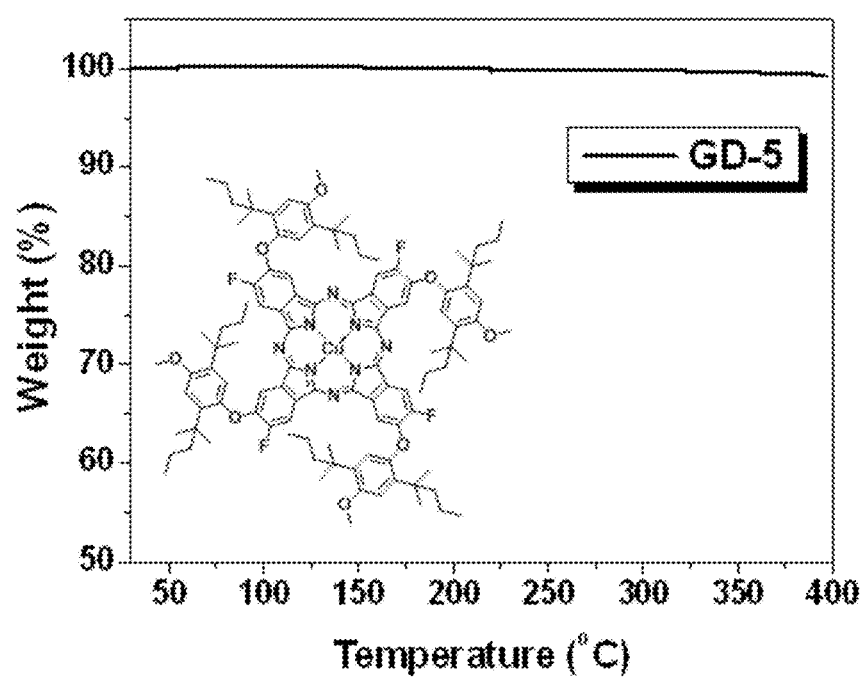
Figure 3F:
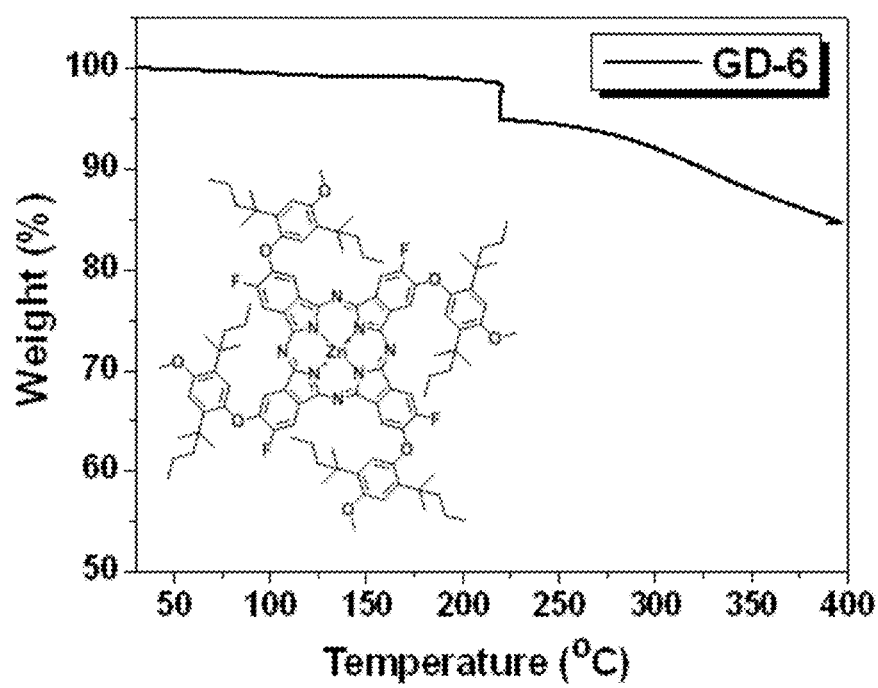
Figure 3G:
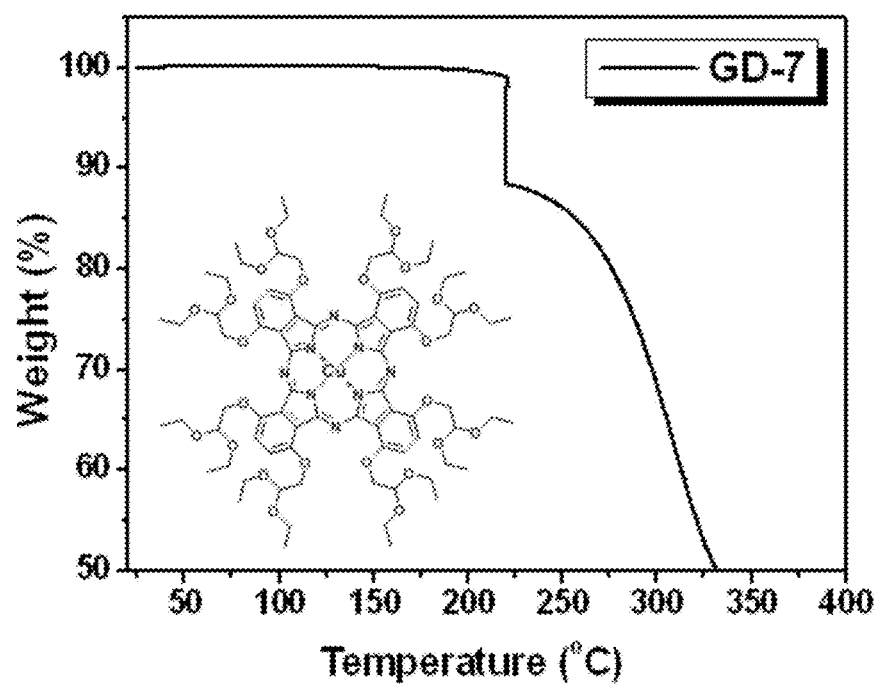
Figure 3H:
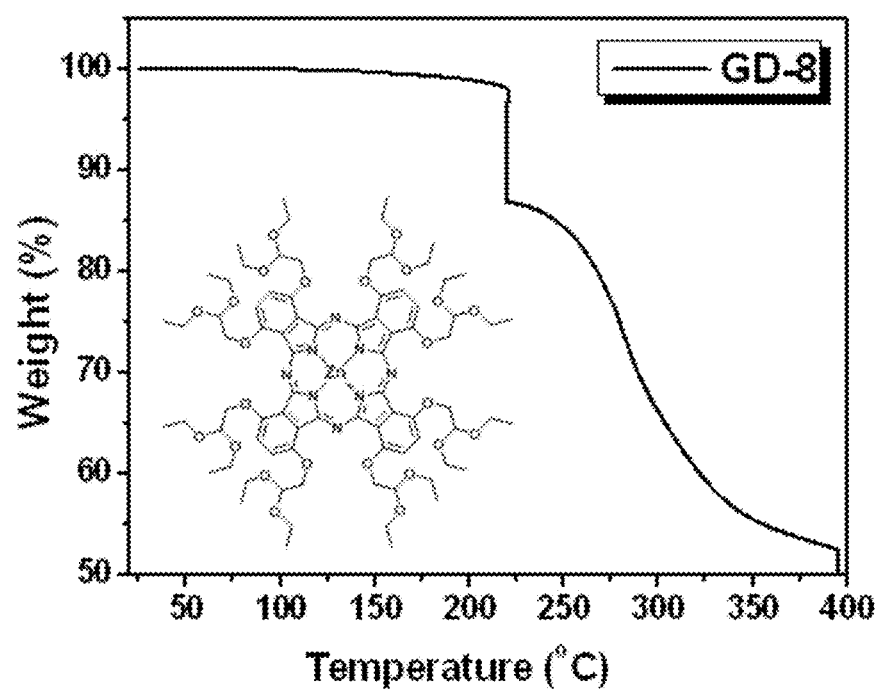

+++: $>5.0 * 10^4$ mg litre$^{-1}$
++: $>5.0 * 10^3$ mg litre$^{-1}$
+: $>5.0 * 10^2$ mg litre$^{-1}$ 2. Spectroscopic Analysis of Dye For GD-1~6, absorption and transmission spectrum in PGEA were analyzed (FIGS. 2A and 2B). It was shown that GD-5,6 where the substituent was introduced to non-peripheral position had wavelength in absorption range adjacent to Near-IR and had about 120,000 of molar extinct coefficient and GD-1~4 where the substituent was introduced to peripheral position showed at least 200,000 of excellent molar extinct coefficient and proper wavelength as green color. These differences are considered that GD-5,6 where the substituent was introduced to non-peripheral position were made its wavelength further longer.

It was found that their transmission degree was excellent in the range of 500 nm~540 nm and GD-1,4 showed the most similar spectrum to Green 58 (G58).

3. Thermal Resistance Analysis of Dye

Through Thermo Gravimetric Analyzer (TGA), Thermogravimetric Analyzer 2050 (TA instruments), thermal resistance of the synthesized dye was measured (FIGS. 3A-3H). For the thermal resistance test, change of mass reduction rate (w %) was measured by passing through isothermal zone at 220° C. for 30 min, raising the temperature to 30° C.~400° C. in 10° C./min. It was found that the synthesized dye having Cu as its central metal had better thermal resistance in general than the dye having Zn. This result seems to be caused by change of phthalocyanine crystal form depending on the metal. It was found that GD-1,5 showed almost no change of mass even at over 300° C. as well as in the isothermal zone and was most stable. For GD-3,4, it was shown than they were stable also to heat and showed only 1-2% of mass reduction in the isothermal zone. GD-6 showed less than 5% of mass 5. Color Filter Application Property Assessment Property Assessment of GD-1 and GD-3

Figure 9:
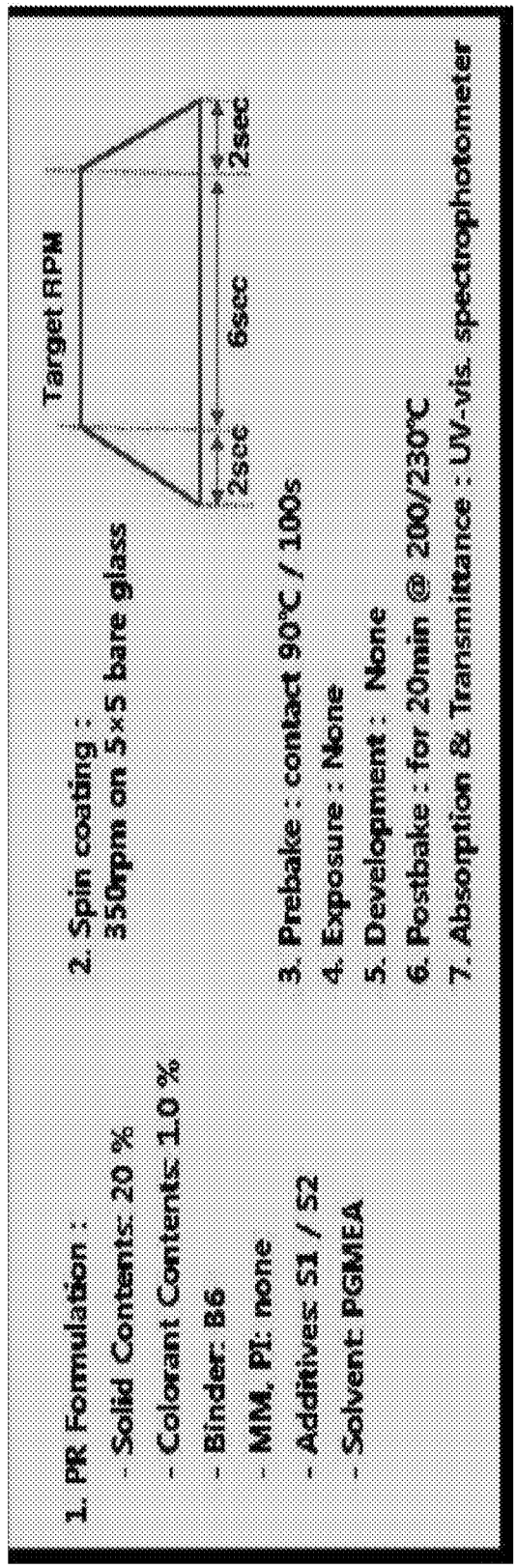
FIG. 9 is showing the condition under which the color filter application property assessment for GD-1 and GD-3 is performed.

Prior to color mixing assessment, spectrum changes were observed after preparing a simple paste containing 1 wt % of dye, coating and then PB (post baking) it by temperatures. Using the observed spectrum, color simulation was performed. The assessment was performed under the condition described in FIG. 9.

Figure 4:
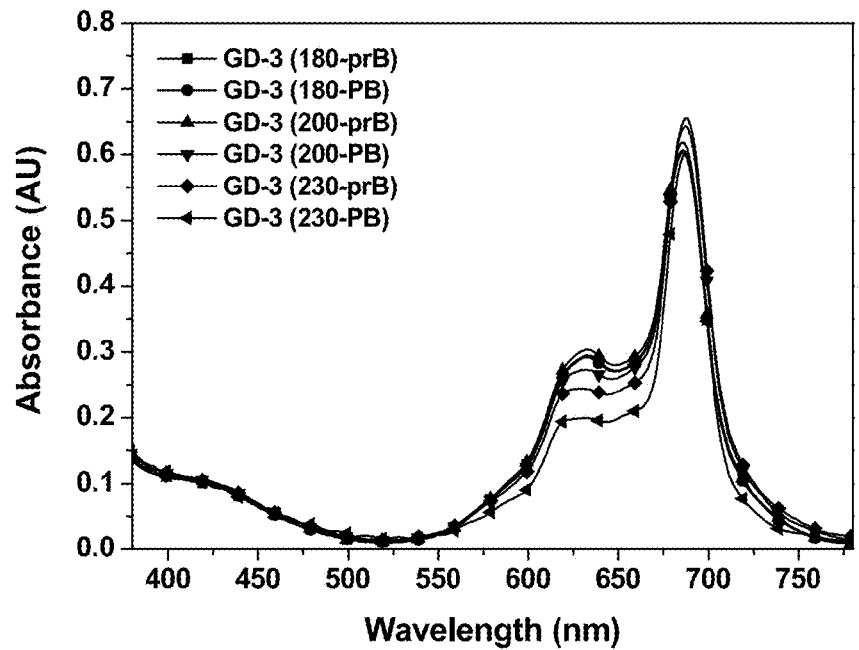
FIG. 4 shows absorption and transmission spectrum of GD-1 and GD-3 by temperatures.
Figure 4:
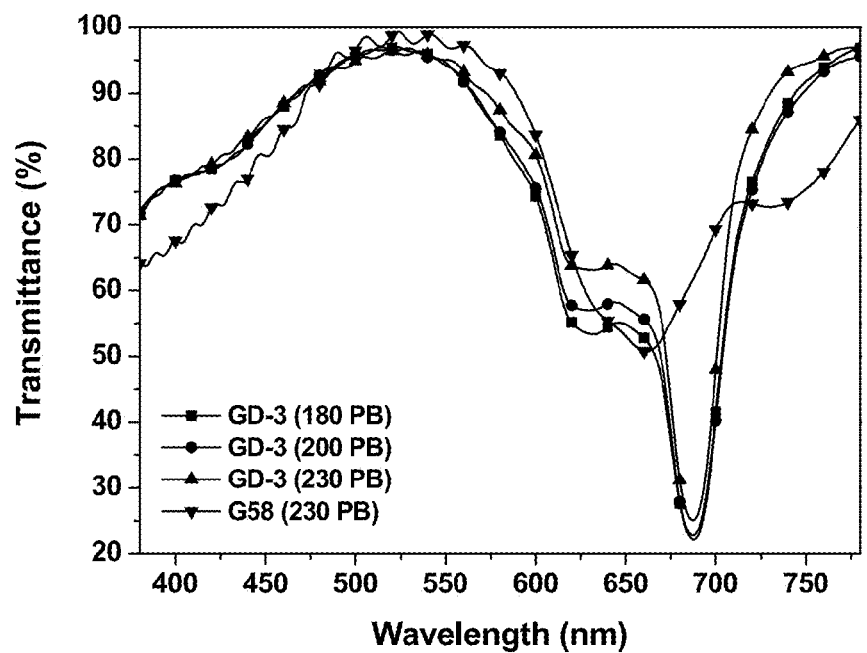
Figure 5A:
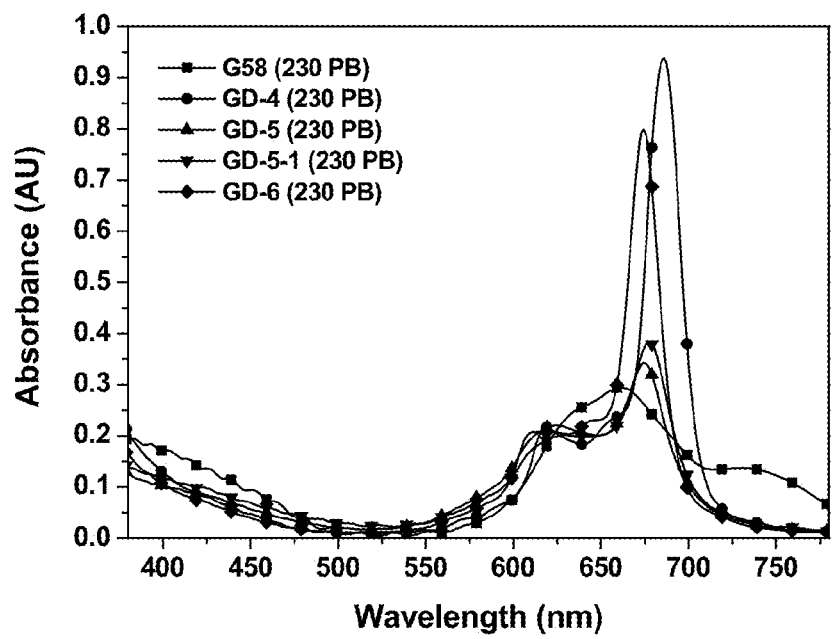
FIG. 5A is an absorption and transmission spectrum graph of GD-4~6 after PB.
Figure 5A:
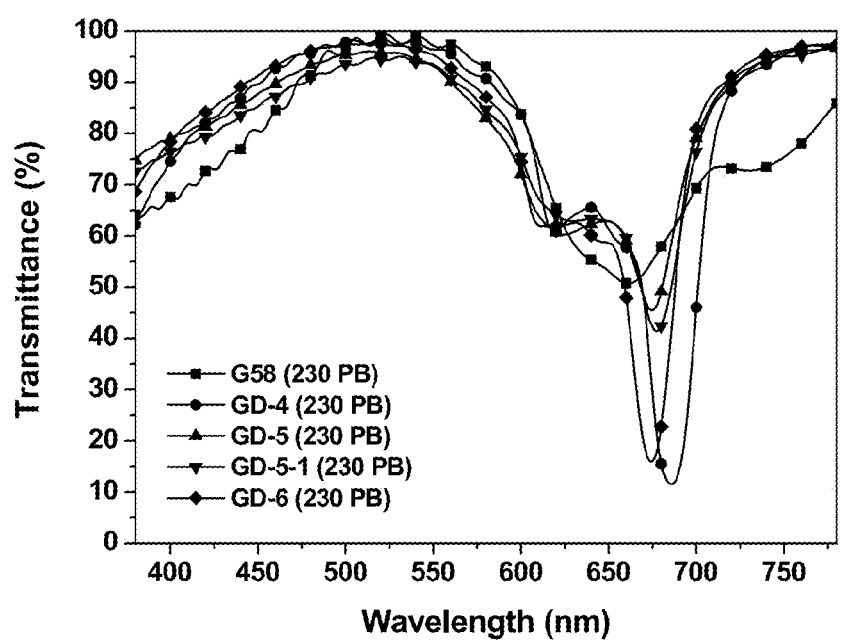
Figure 5B:
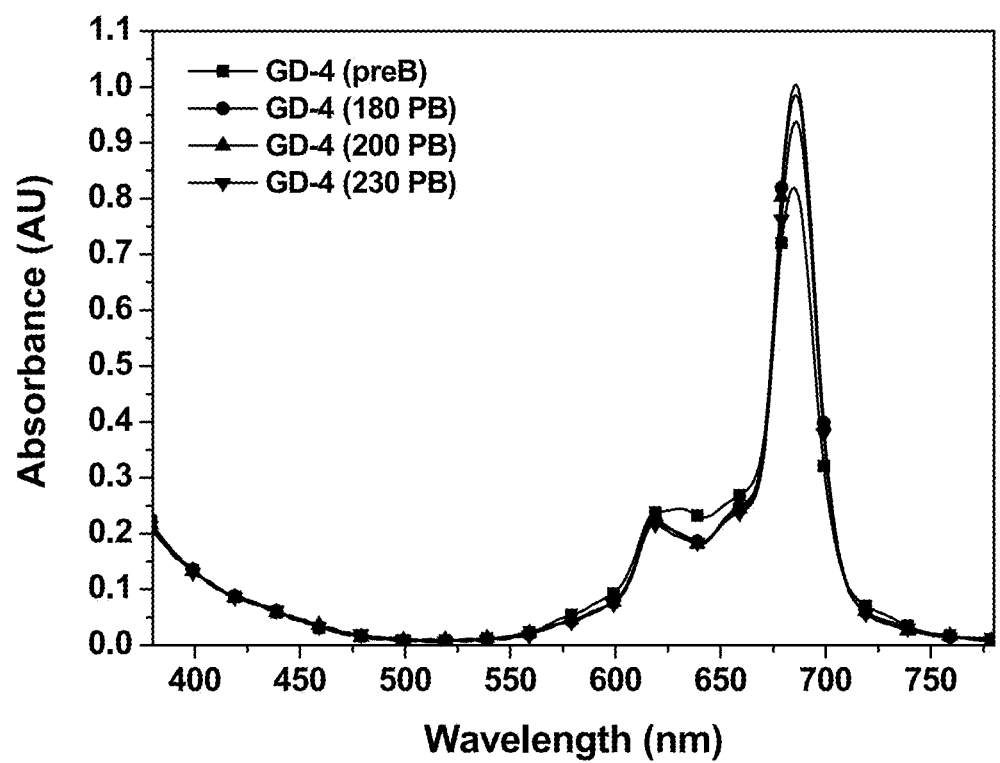
FIG. 5B is an absorption spectrum graph of GD-4 by temperatures.
Figure 5C:
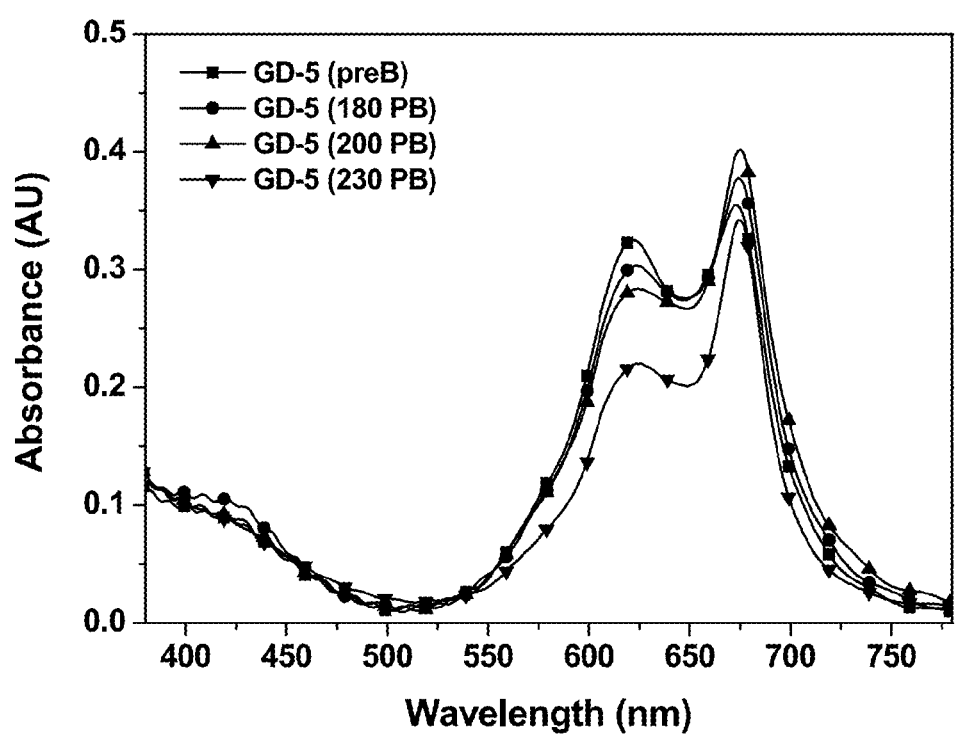
FIG. 5C is an absorption spectrum graph of GD-5 by temperatures.
Figure 5D:
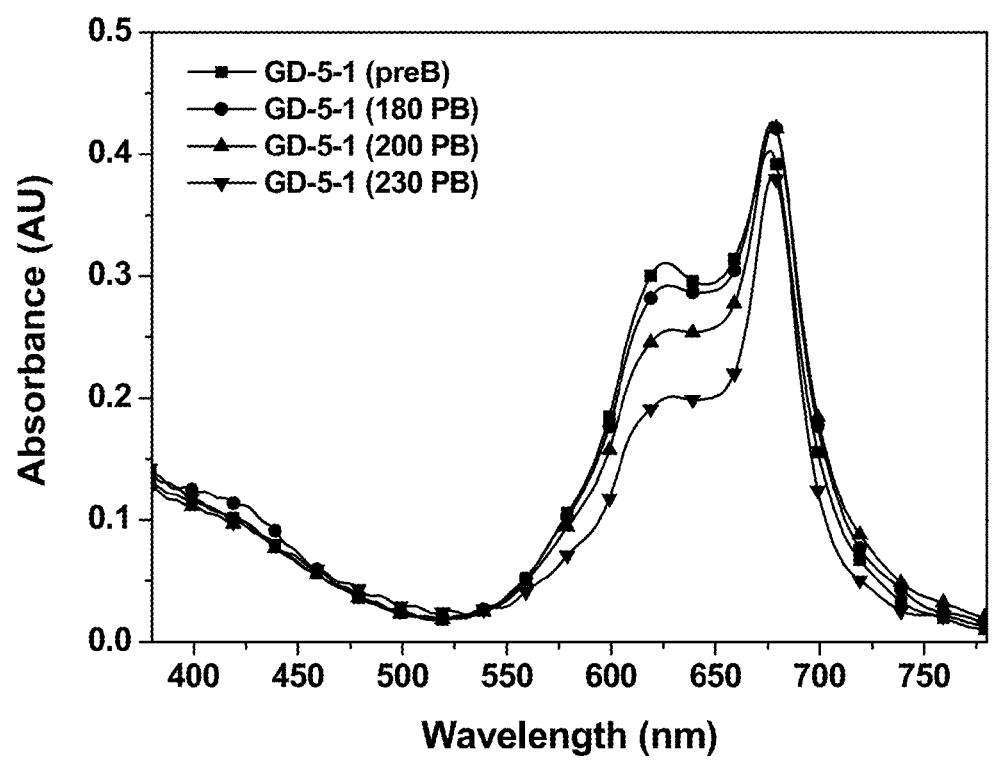
FIG. 5D is an absorption spectrum graph of GD-5-1 by temperatures.
Figure 5E:
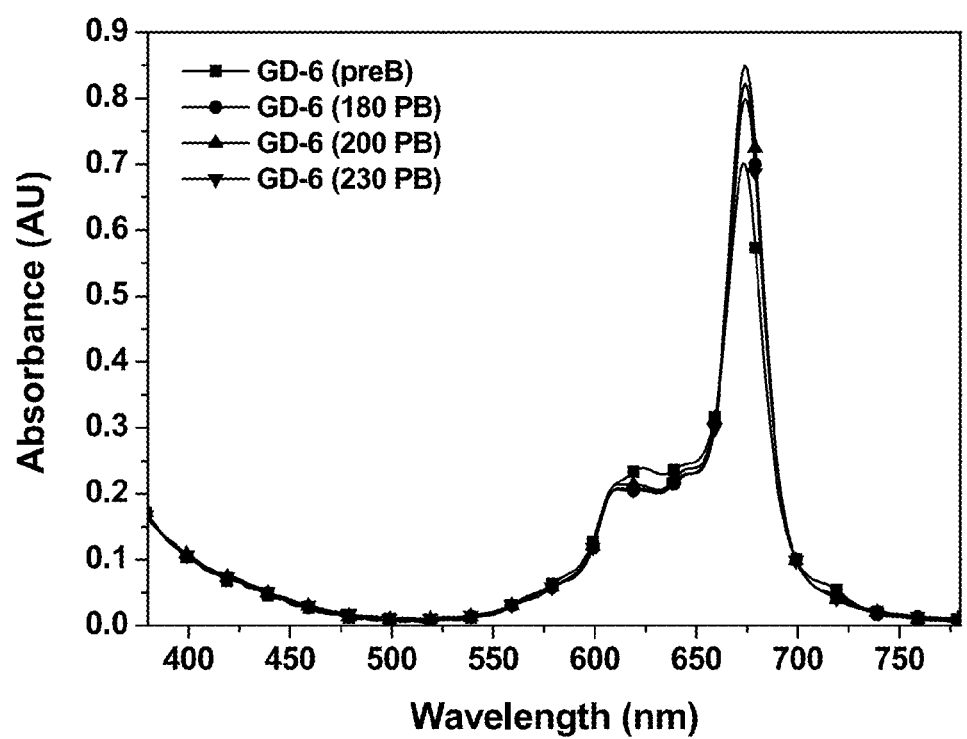
FIG. 5E is an absorption spectrum graph of GD-6 by temperatures.

The results were shown in FIG. 4. Because GD-3 had better solubility to PGMEA than GD-1, only GD-3 was fixed as 1% against the content of G58 and the spectrum was compared. It was suggested that Q-band decreased a little after PB at 180/200/230° C., but its thermal resistance was excellent.

Property Assessment of GD-4, GD-5, GD-5-1, GD-6, GD-11, and GD-12

Figure 10:
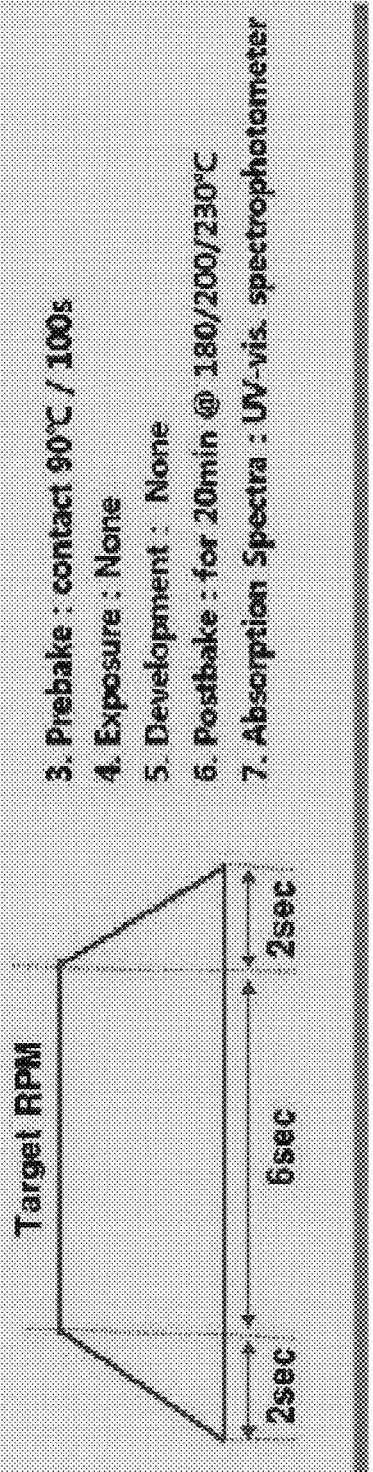
FIG. 10 is showing the condition under which the color filter application property assessment for GD-4, GD-5, GD-5-1, GD-6, GD-11, and GD-12 is performed.

Using the same method in 5.(1), color filter application properties of GD-4, GD-5, GD-5-1, GD-6, GD-11, and GD-12 were analyzed. Wherein, GD-5-1 is an isomer of GD-5. The assessment was performed under the condition described in FIG. 10.

The results were shown in FIG. 5. FIG. 5A is absorption and transmission spectrum of GD-4~6 after PB. It was suggested that GD-4 showed the most similar spectrum to G58. FIGS. 5B-5E are absorption spectrum graphs of GD-4~6 by temperatures after PB. The absorption peaks of GD-4 and GD-6 decrease around 600 nm after PB and increase around 630 nm. The accurate reason that the above mentioned results are developed has not been identified, but it is considered that it may be caused by complex reasons such as peak change from re-crystallization of dye after PB, degradation of substituents from heat energy, or effect of phthalocyanine isomer.

(3) Secondary Color Filter Application Property Assessment—GD-4

Figure 11:
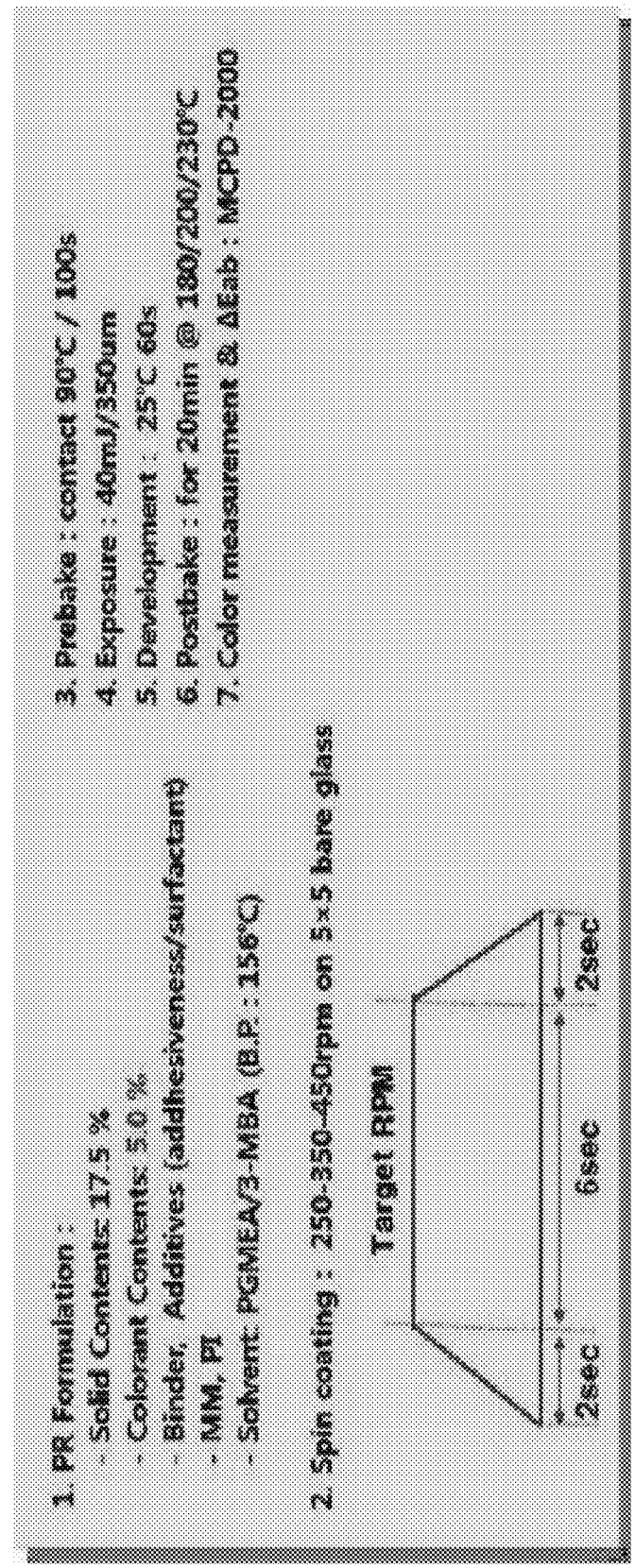
FIG. 11 is showing the condition under which the color filter application property assessment for GD-4 is performed.

For GD-4 showing the best physical property in assessment of 5.(1) and 5.(2), independent PR and color mixing assessment were performed. The assessment was performed under the condition described in FIG. 11.

temperature process over 200° C., the color change from degradation of the dye becomes more severe.

Figure 6A:
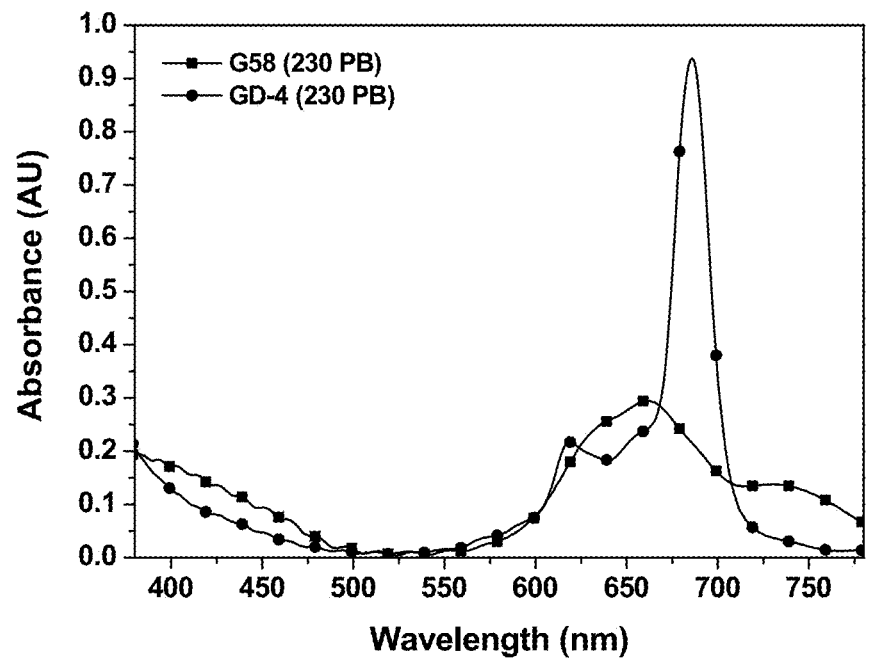
FIG. 6A is comparison of absorption spectrum between GD4 of the present invention and the conventional dye G58 and an absorption spectrum graph of GD-4 by temperatures.
Figure 6A:
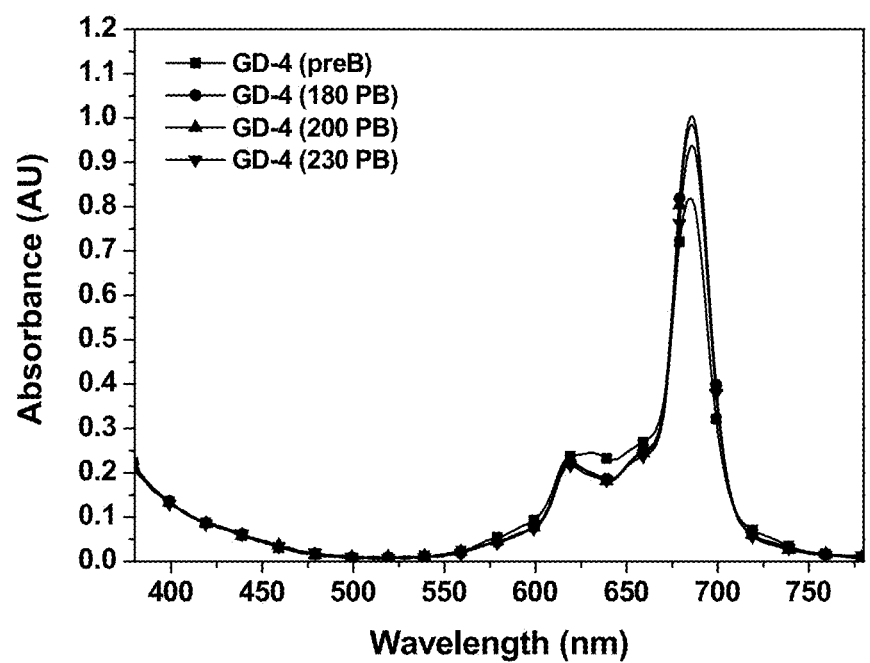
Figure 6B:
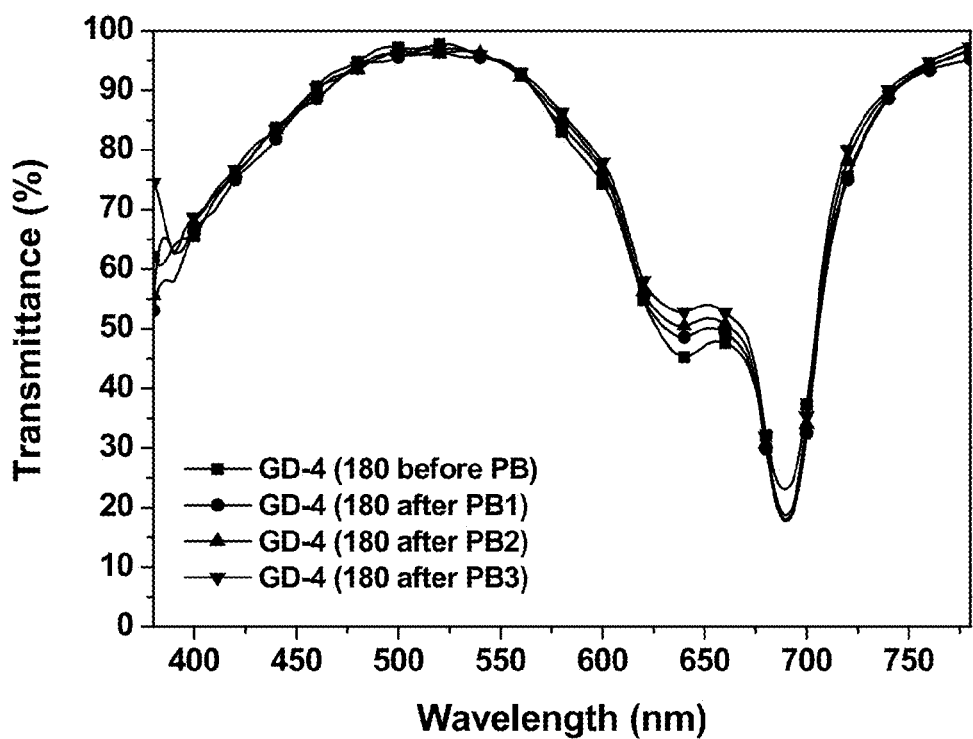
FIGS. 6B-6D are transmission spectrum graphs of GD-4 by temperatures and number of PB.
Figure 6C:
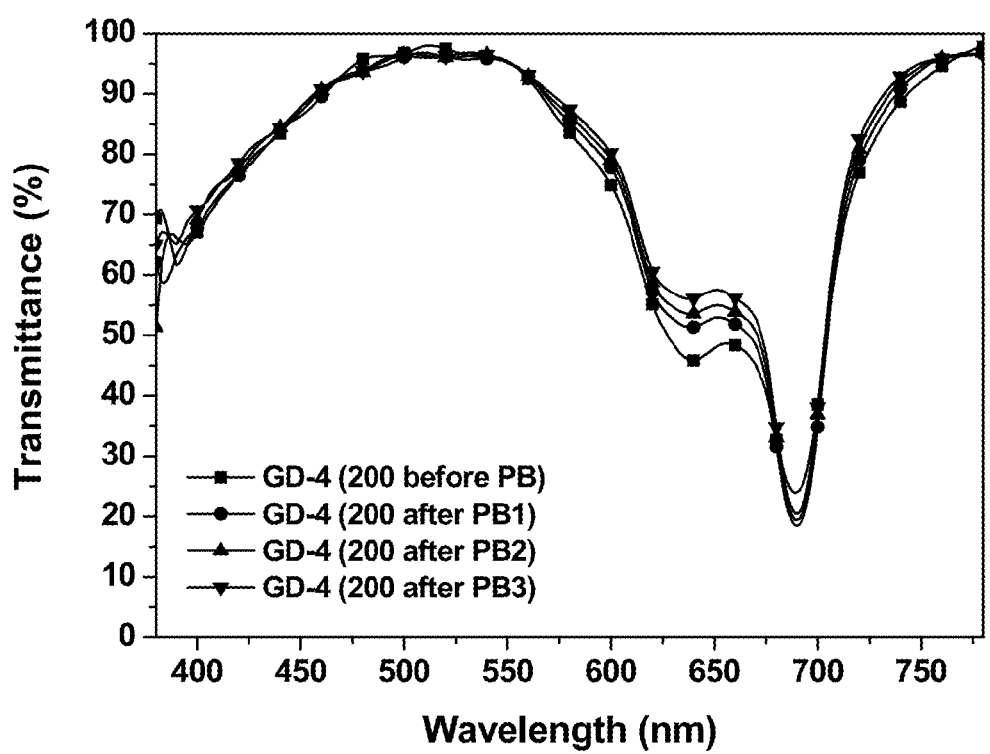
Figure 6D:
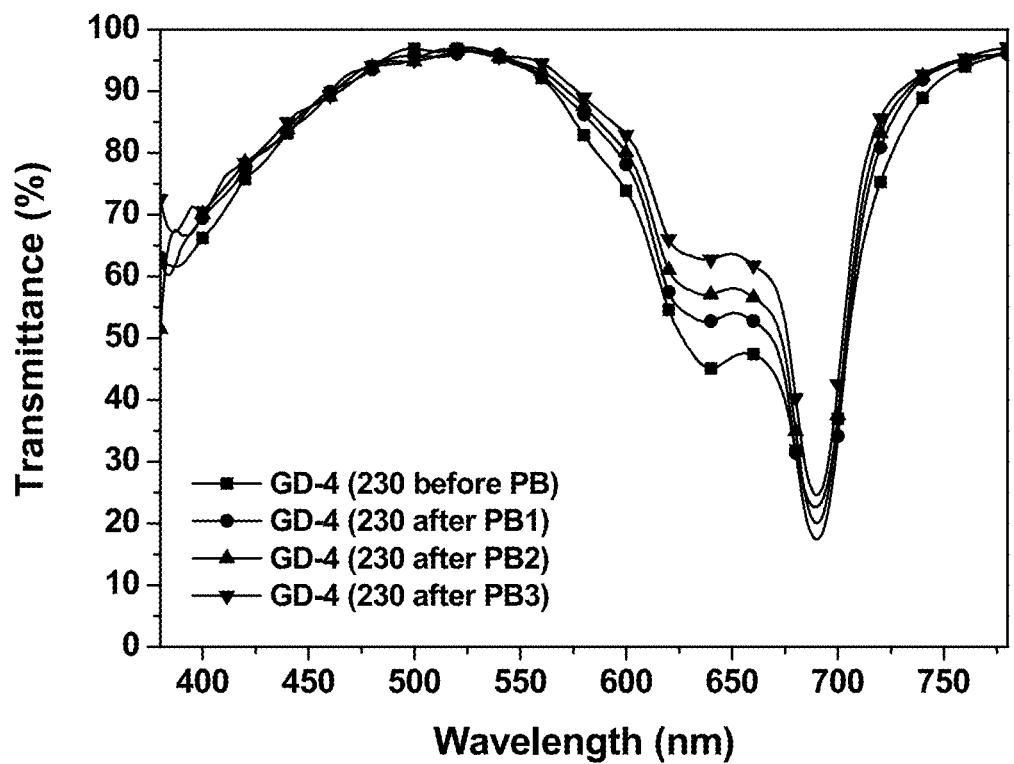
Figure 6E:
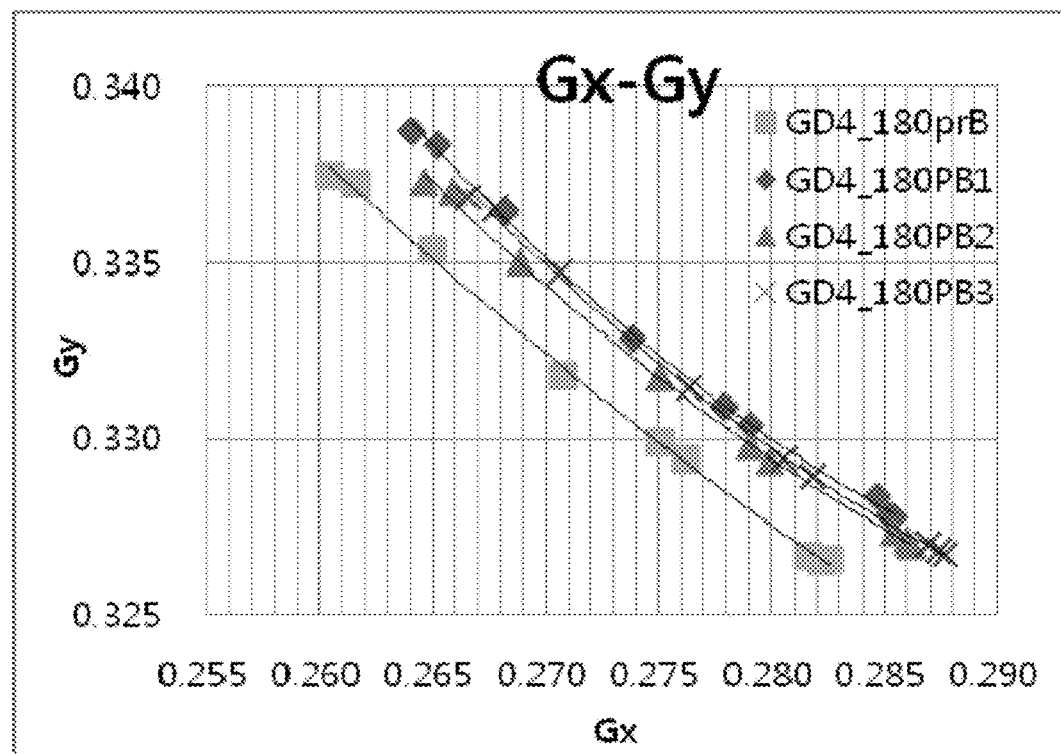
FIGS. 6E-6J are graphs showing change of color coordinate values of GD-4 by temperatures and number of PB.
Figure 6F:
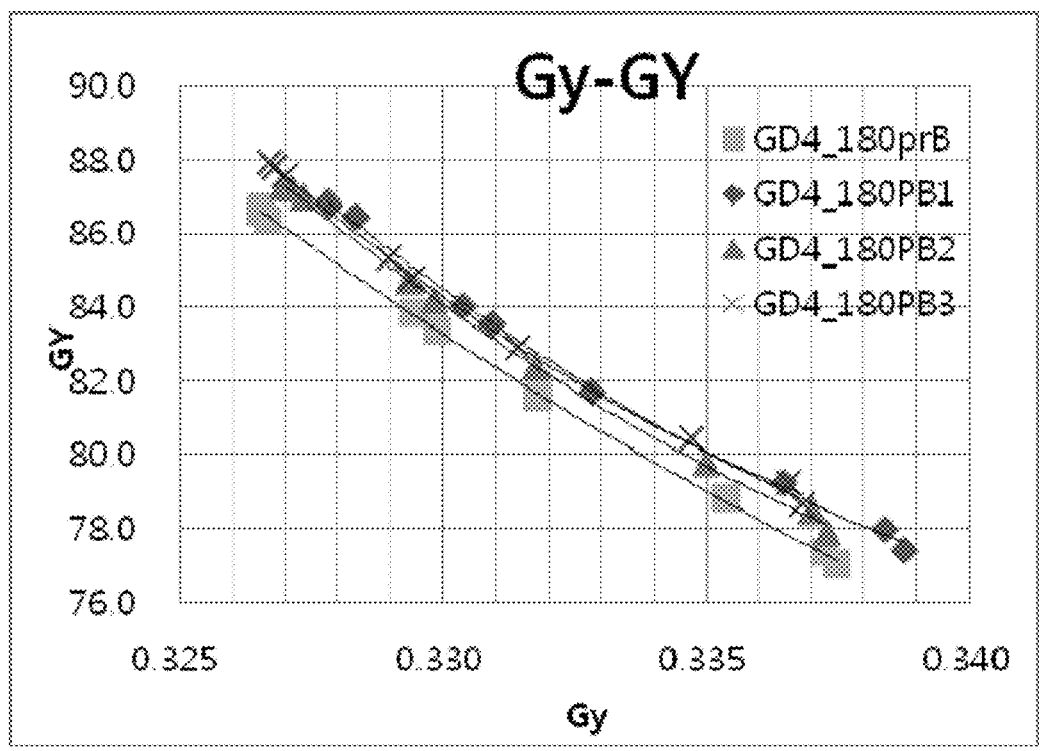
Figure 6G:
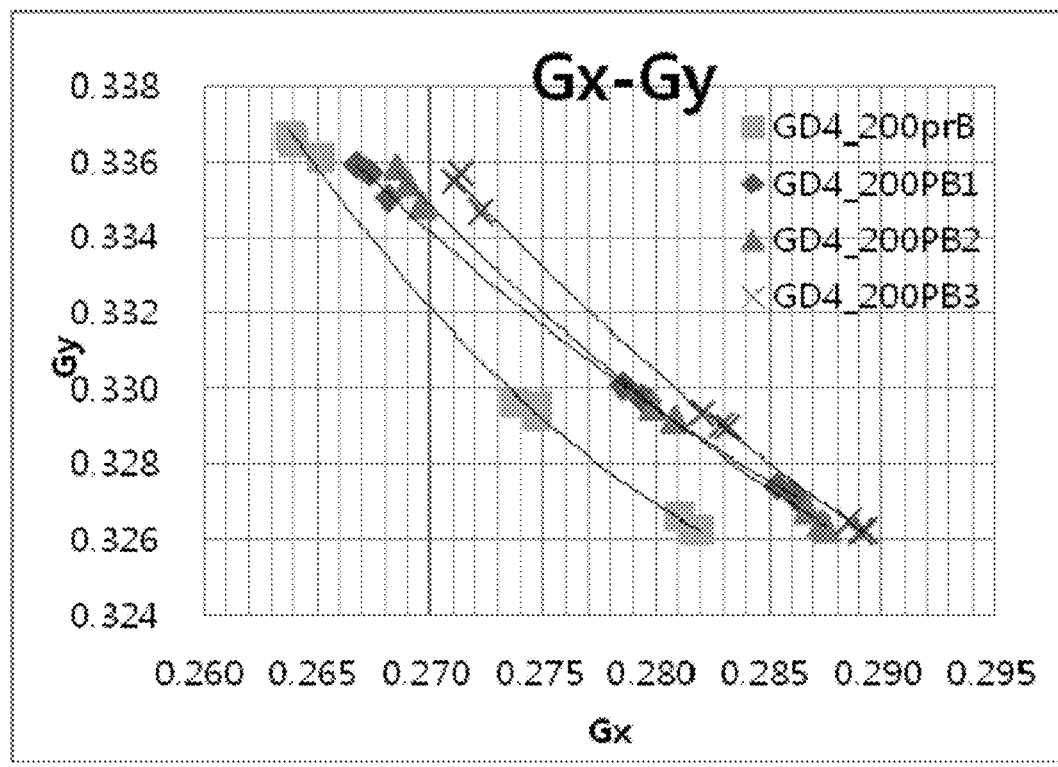
Figure 6H:
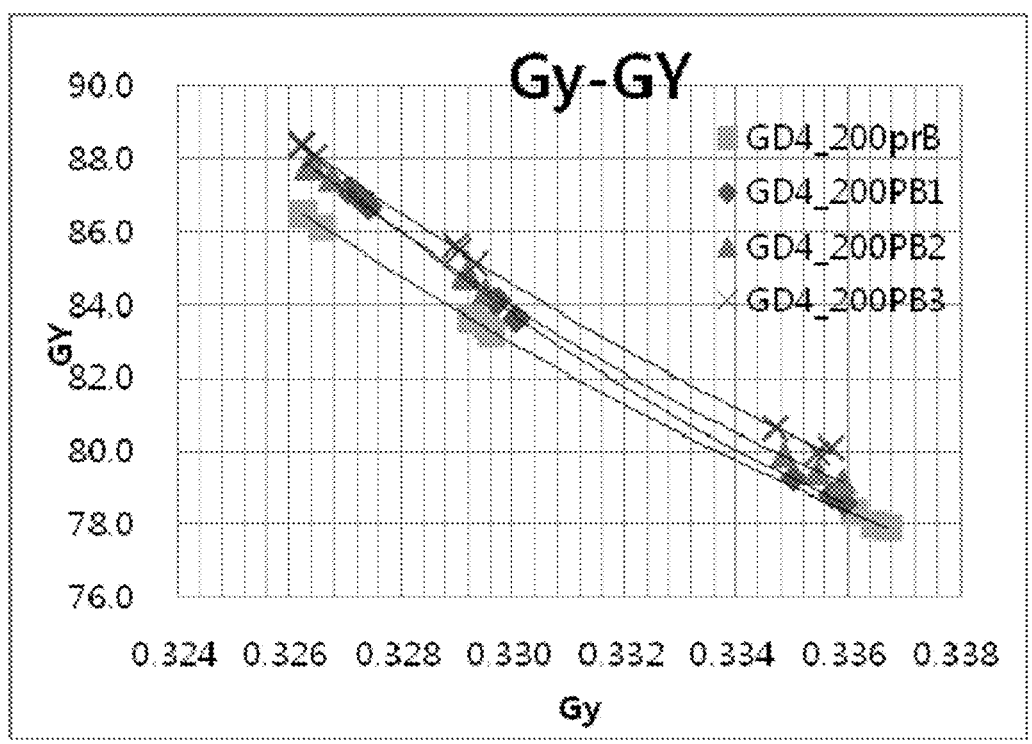
Figure 6I:
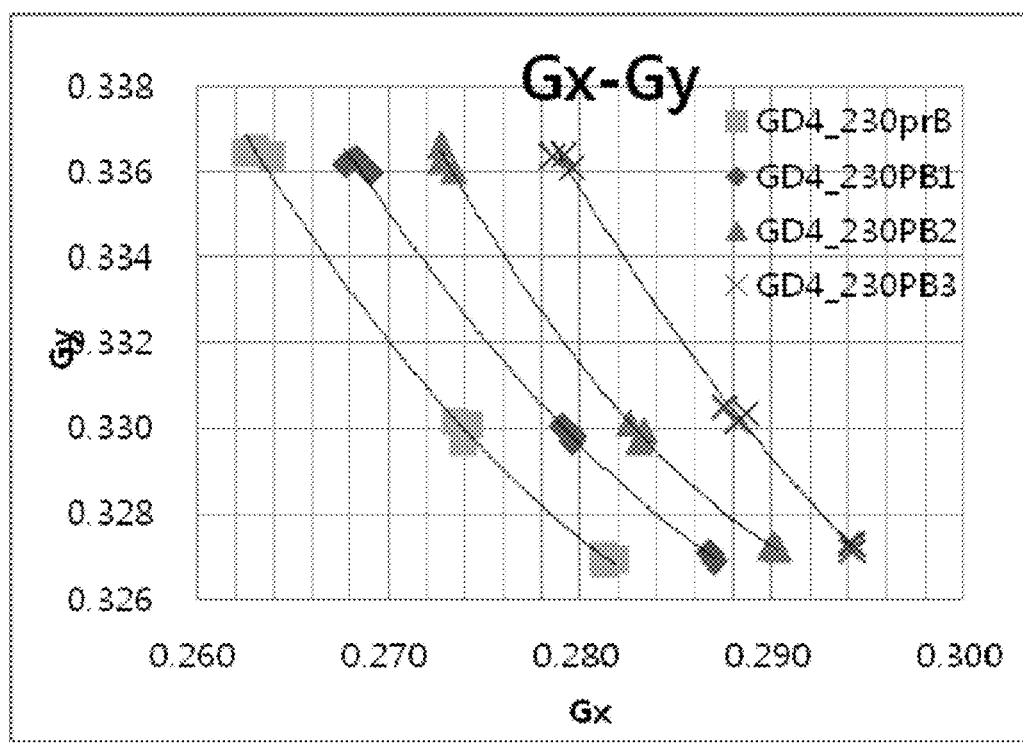
Figure 6J:
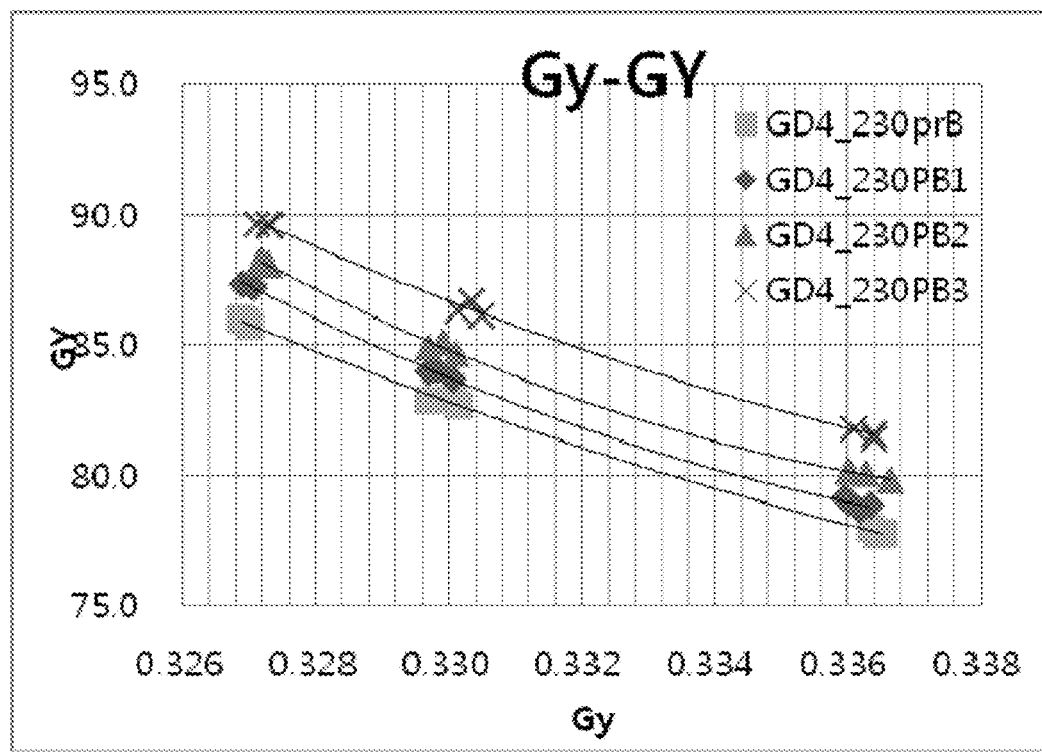
Figure 6K:
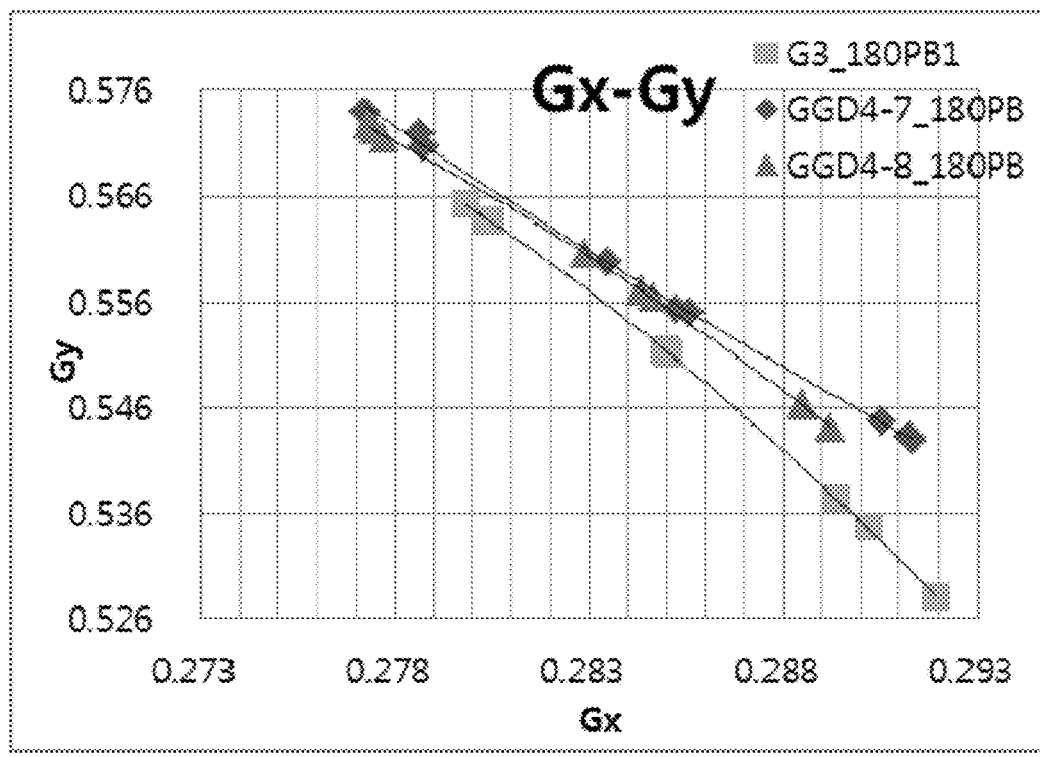
FIG. 6K and FIG. 6L are graphs showing change of color coordinate values of GD-4 by color mixing against the conventional G3.
Figure 6L:
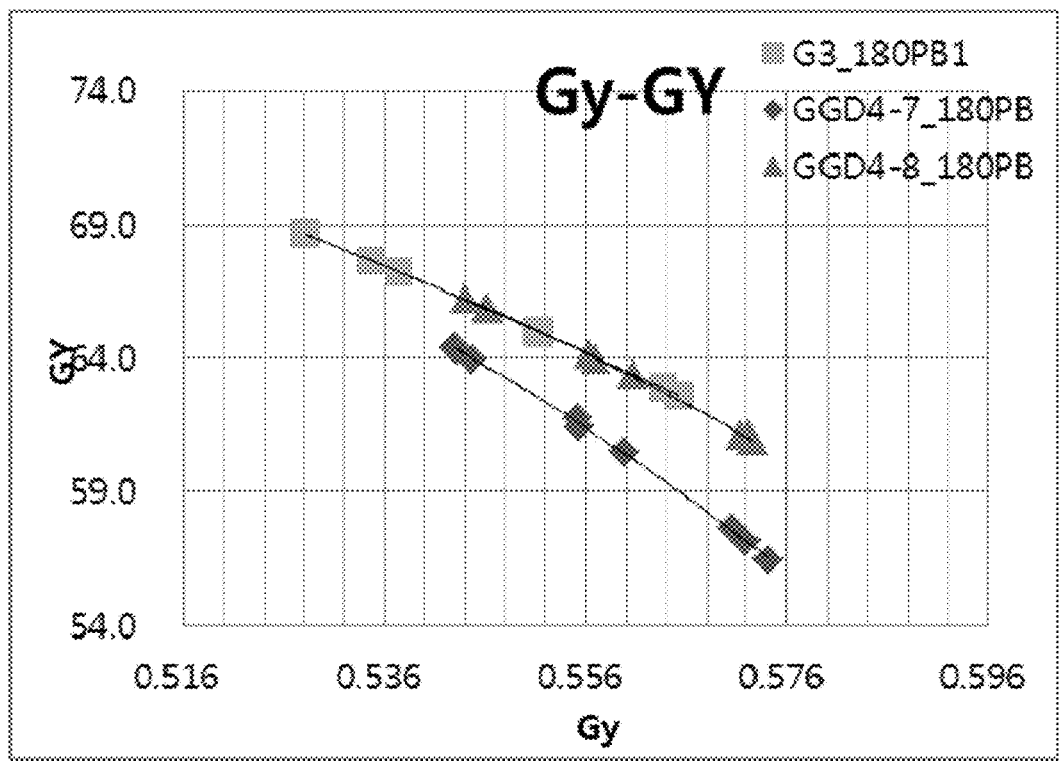

FIGS. 6K and 6L and below Table 3 show change of color coordinate values according to color mixing of GD-4 dye against G3 by making K-binder (dye dispersion improvement type) PR, which is considered to be suitable to the dye form.

TABLE 3

| @Gx 0.283/<br>Gy 0.556 | G58<br>replacement | G58/Y138/GD4<br>(%) | Binder | Gx | GY | modified<br>GY | ΔGY<br>vs. G3 |
|---|---|---|---|---|---|---|---|
| G3_180PB | 0% | 72/28/0 | K | 0.2834 | 64.12 | 64.12 | — |
| GGD4-7_180PB1 | 100% | 0/47/53 | K | 0.285 | 61.4 | 61.0 | ▼3.12 |
| GGD4-8_180PB2 | 15% | 58/32/10 | K | 0.2847 | 64.2 | 63.86 | ▼0.26 |

The results were shown in FIG. 6. FIG. 6A shows comparison of absorption spectrum with G58 and absorption spectrum by temperature of GD-4. In case of GD-4 single color assessment, it was found that compared with G58, the absorption was formed somewhat high (blue circle), the absorption spectrum after PB decreased somewhat around 600 nm, and the absorption increased again around 630 nm. As mentioned in the above, it is considered that these results occurred from diverse and complex causes by peak change from recrystallization of dye after PB, degradation of substituent from heat energy, or phthalocyanine isomers.

FIGS. 6B-6D show transmission spectrums of GD-4 by temperature and number of PB. It was found that the solubility of GD-4 to PGMEA was excellent, as more than 5%. Its spectroscopic change showed satisfactory level in treatment at 180/200° C.

As shown in below Table 2, it was found that in spectroscopic changes of GD-4 by number of PB, the spectroscopic change at each temperature after the first PB showed satisfactory physical property as values of ΔEab≤3, but the spectroscopic change after the second and third PB increased gradually. Especially, the larges spectroscopic change at high temperature, 230° C., means that thermal resistance of the dye is somewhat insufficient at high temperature, 230° C. In addition, it was shown that increase values by number of PB were not saturated and increased continuously. It seems that it is because of absorbance reduction of the dye by degradation of the dye.

TABLE 2

| | Spectroscopic change<br>by # of PB (ΔEab) |
|---|---|
| 180° C. | 1.46 → 2.14 → 3.14 |
| 200° C. | 2.19 → 3.13 → 4.36 |
| 230° C. | 2.99 → 5.03 → 7.78 |

FIGS. 6E-5J show changes of color coordinate of GD-4 depending on PB repetition and changes of luminance value in state that the y coordinate is fixed. It was found that at 180° C., there was a tendency that the values came to be saturated to some extent but at 200° C./230° C., the degree of color change increased gradually with washing-out depending on the number of repetition. Considering the above color coordinate change graph, it is identified that GD-4 is more suitable to low temperature process at 180° C. than high temperature process at over 200° C. and shows a trend that in the high It was found that when substituting 15% of GD-4 dye, there was almost no luminance reduction compared with the pigment type.

Figure 6M:
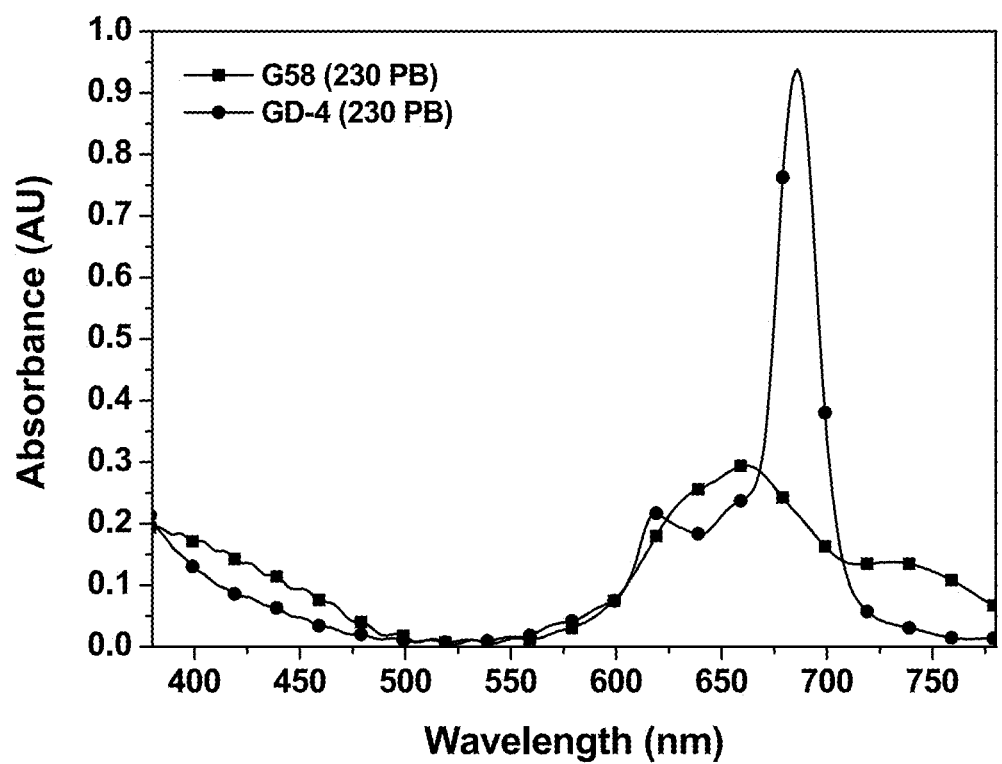
FIG. 6M is a graph showing color mixing absorption of the dye GD-4.
Figure 6N:
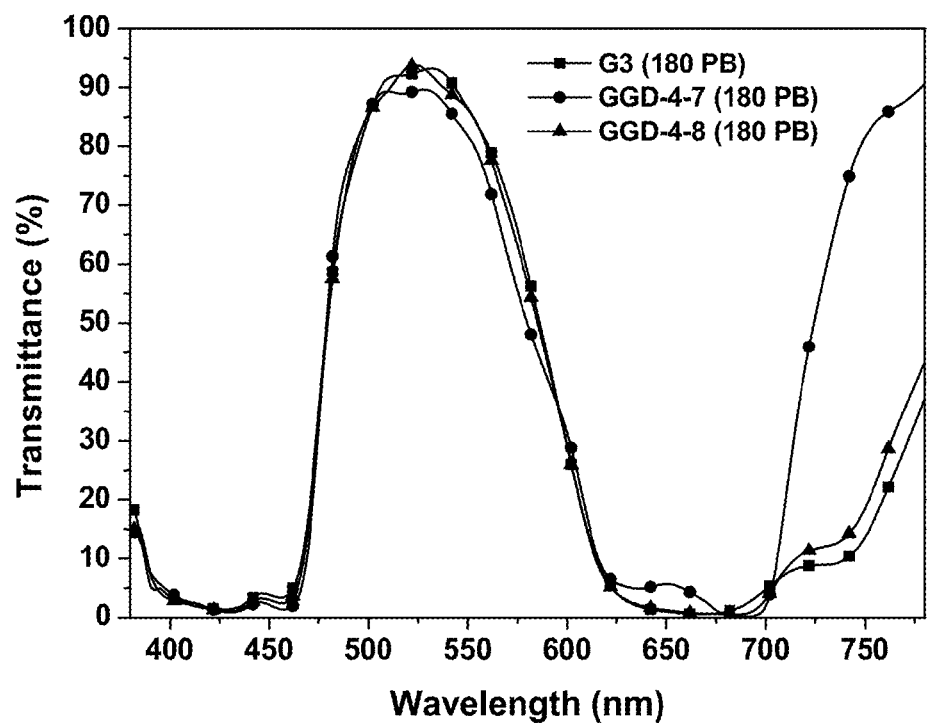
FIG. 6N is a graph showing transmission spectrum of the dye GD-4.
Figure 6O:
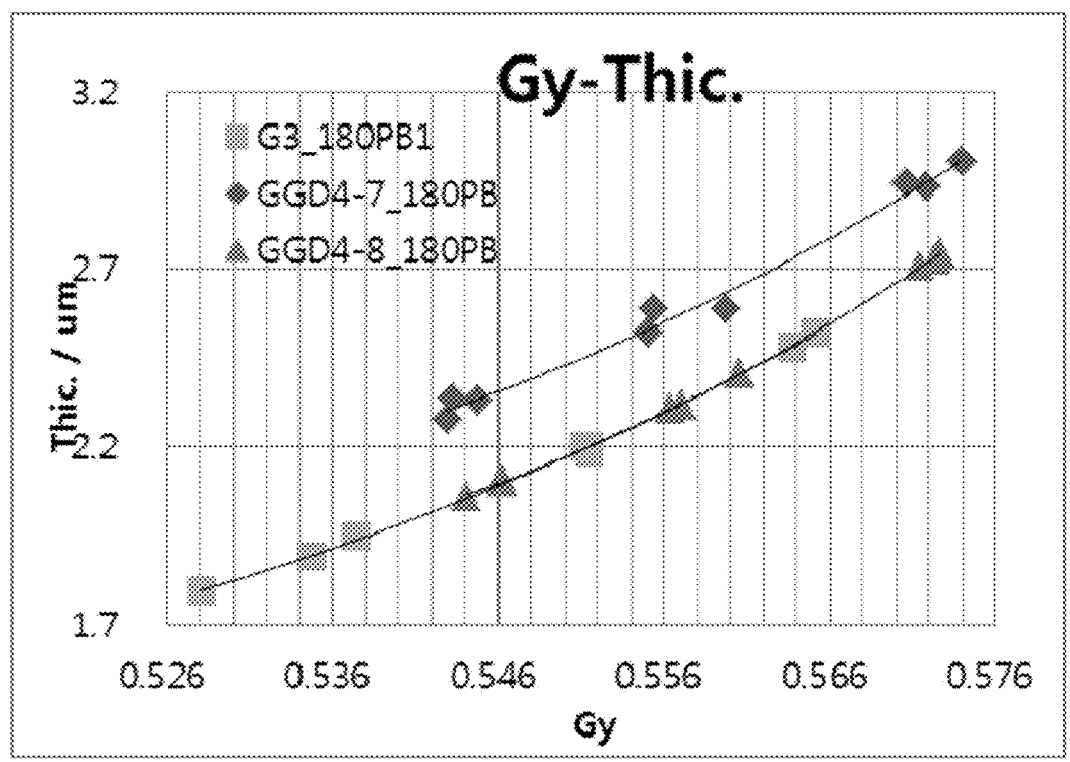
FIG. 6O is a graph showing coloring of the dye GD-4.
Figure 7A:
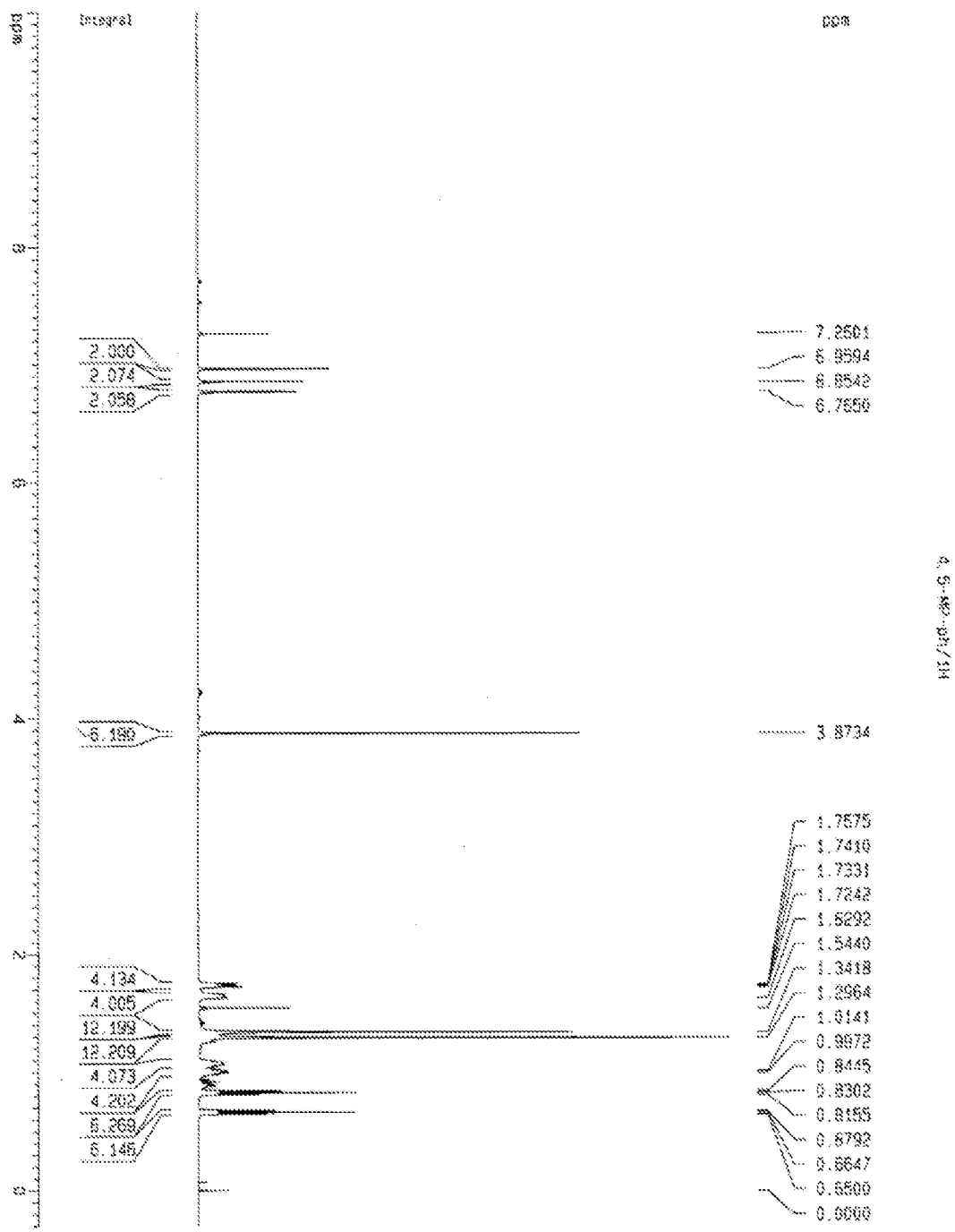
FIG. 7A is a NMR ($^1$H) result confirming precursor synthesis of GD-1,2.
Figure 7B:
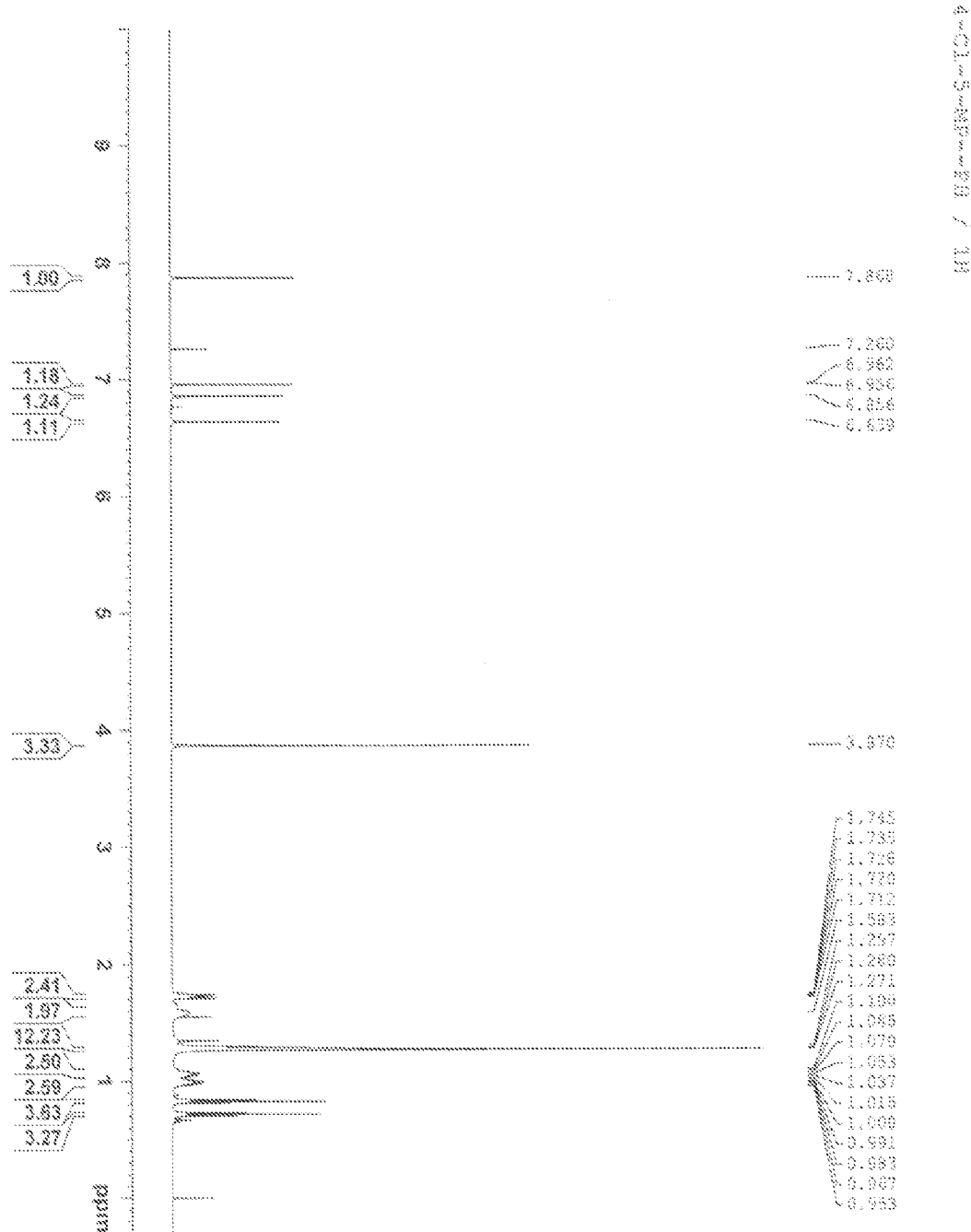
FIG. 7B is a NMR ($^1$H) result confirming precursor synthesis of GD-3.4.
Figure 7C:
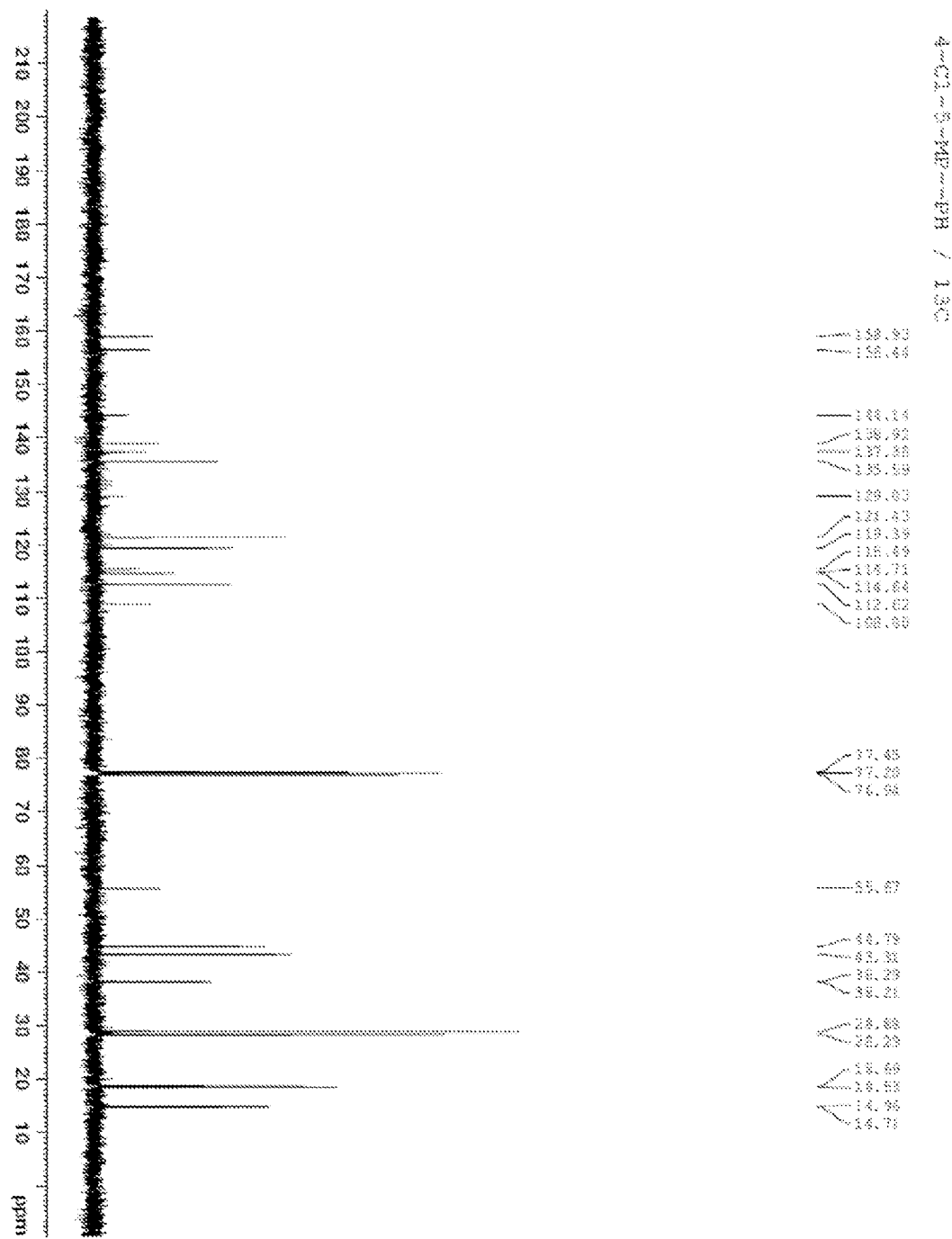
FIG. 7C is a NMR ($^{13}$C) result confirming precursor synthesis of GD-3.4.
Figure 7D:
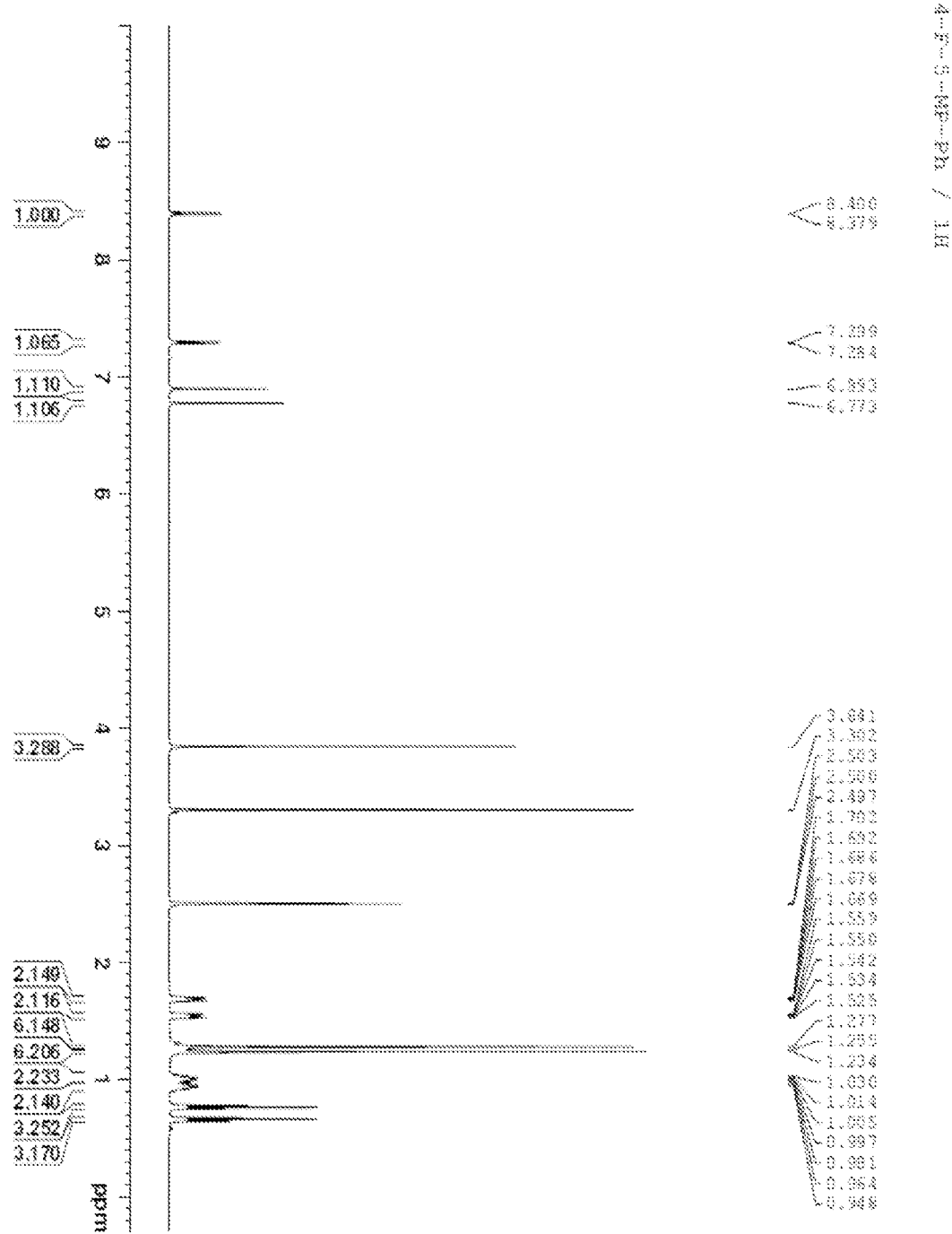
FIG. 7D is a NMR ($^1$H) result confirming precursor synthesis of GD-5.6.
Figure 7E:
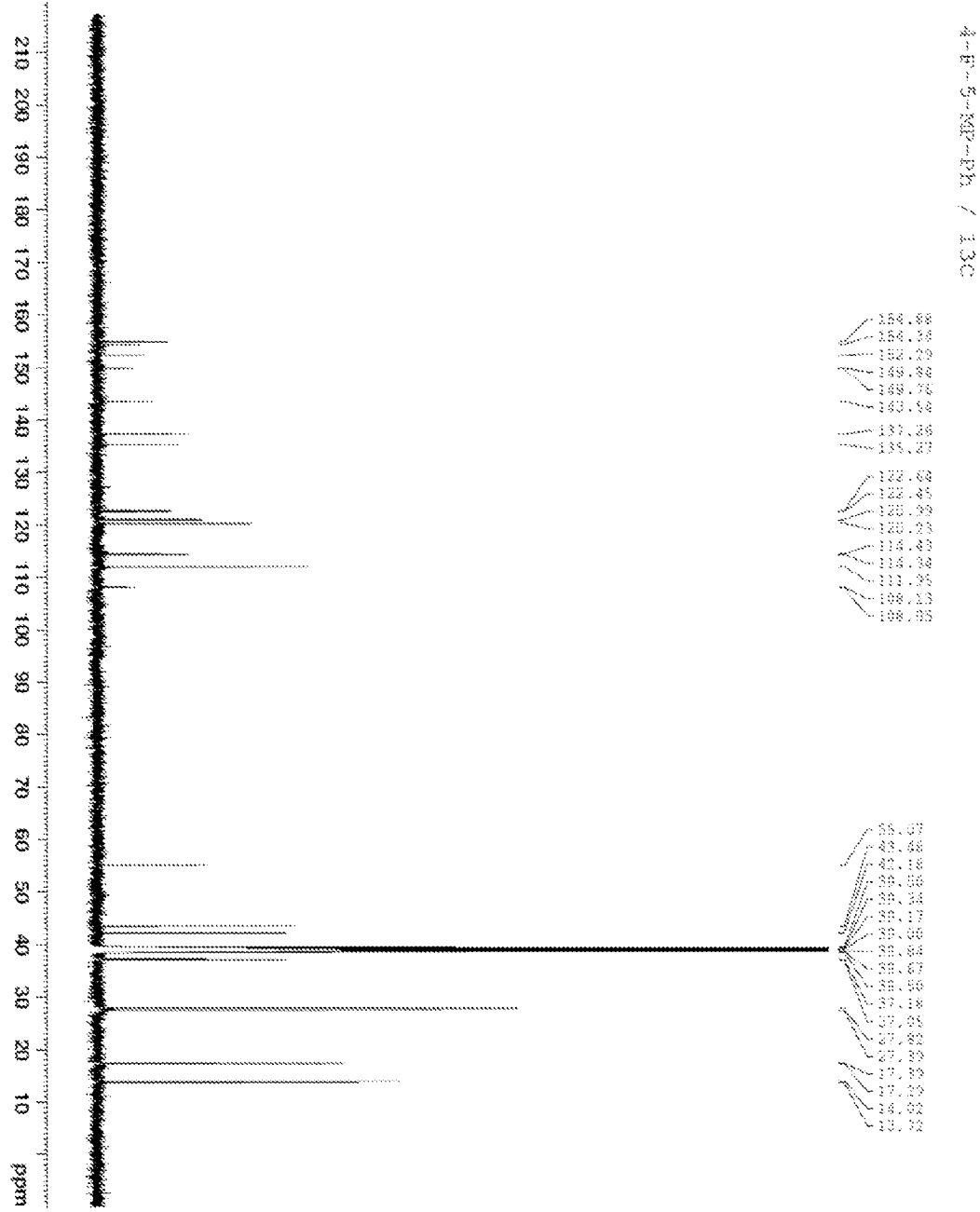
FIG. 7E is a NMR ($^{13}$C) result confirming precursor synthesis of GD-5.6.
Figure 7F:
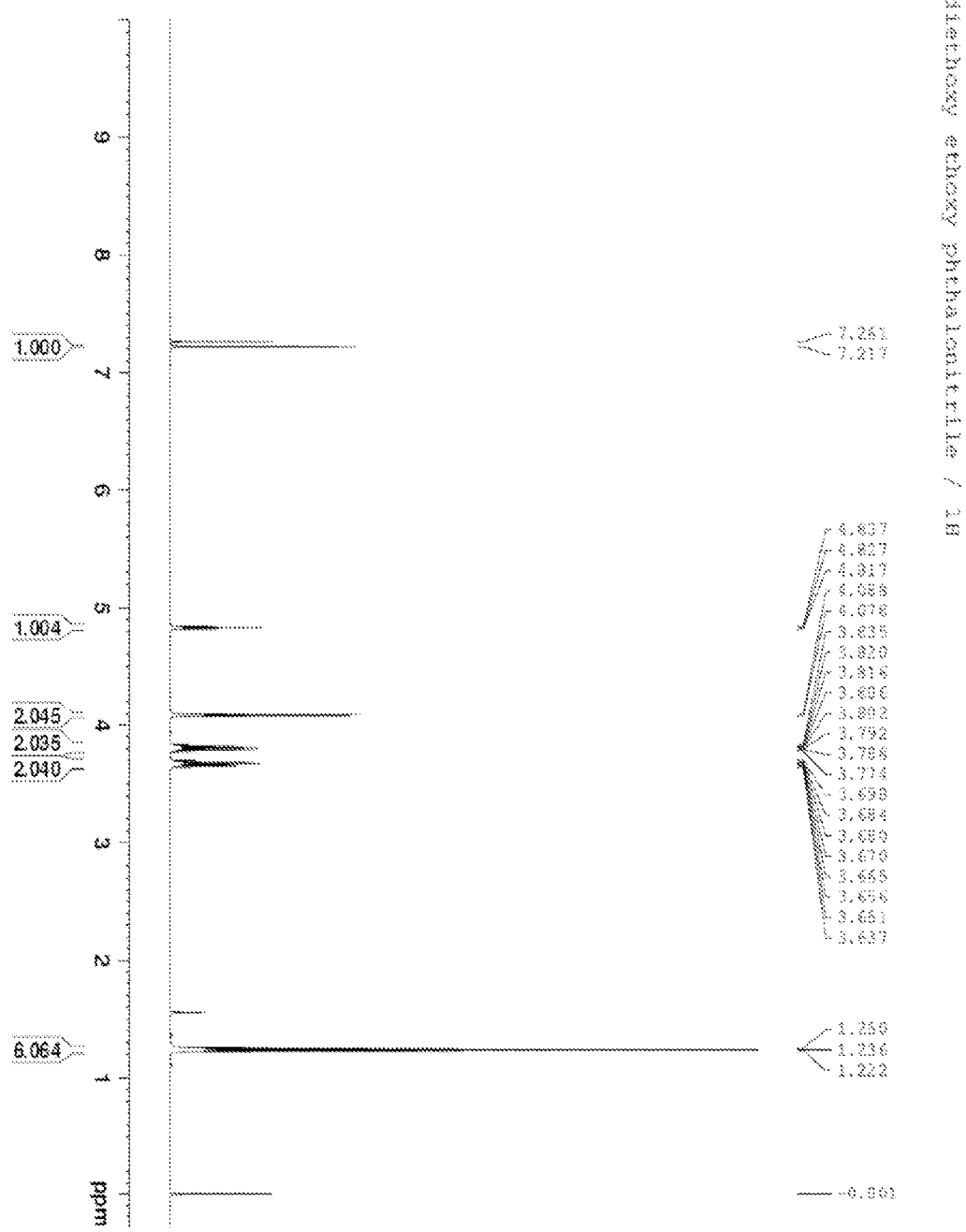
FIG. 7F is a NMR ($^1$H) result confirming precursor synthesis of GD-7.8.
Figure 7G:
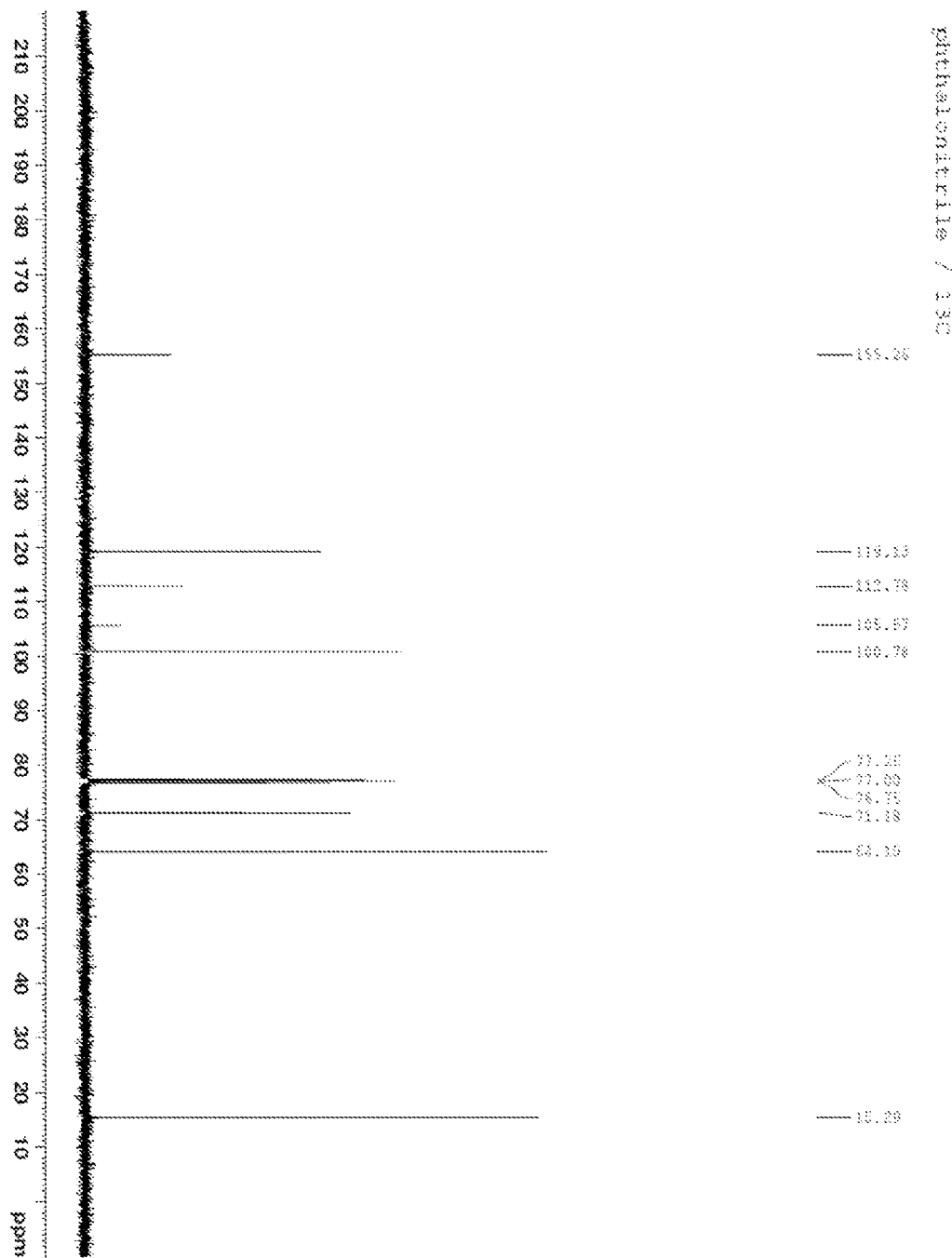
FIG. 7G is a NMR ($^{13}$C) result confirming precursor synthesis of GD-7.8.
Figure 7H:
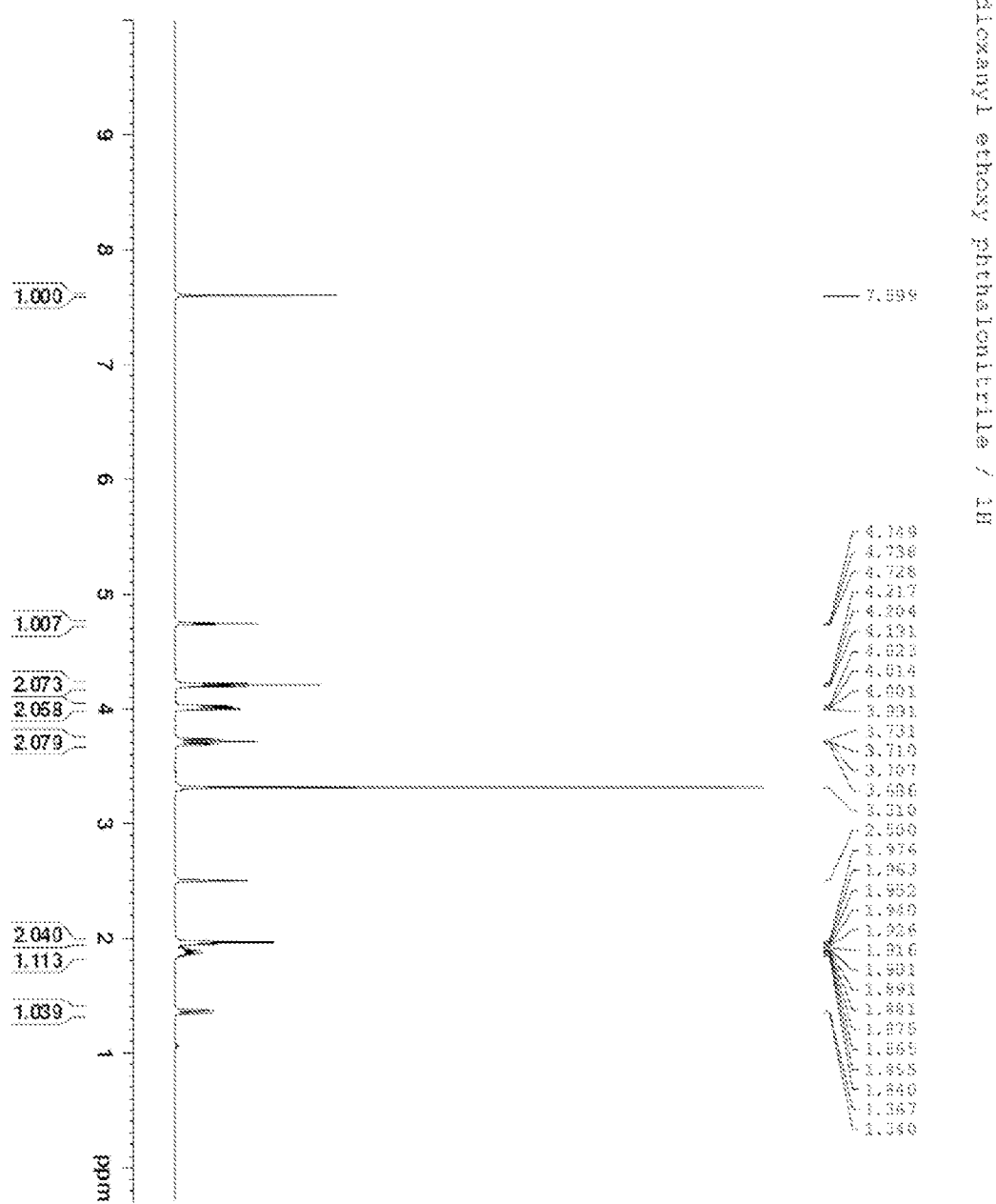
FIG. 7H is a NMR ($^1$H) result confirming precursor synthesis of GD-9.10.
Figure 7I:
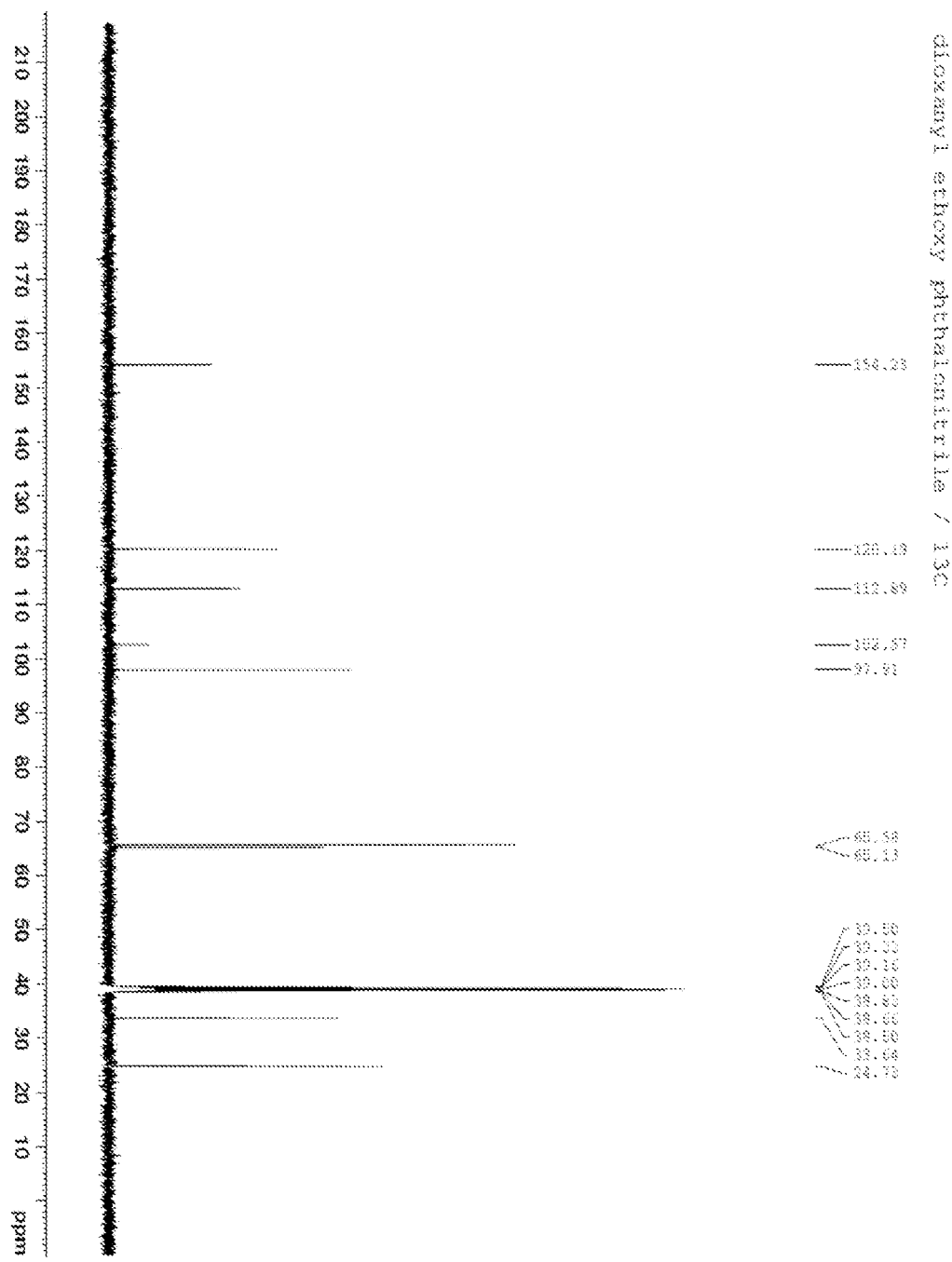
FIG. 7I is a NMR ($^{13}$C) result confirming precursor synthesis of GD-9.10.
Figure 8A:
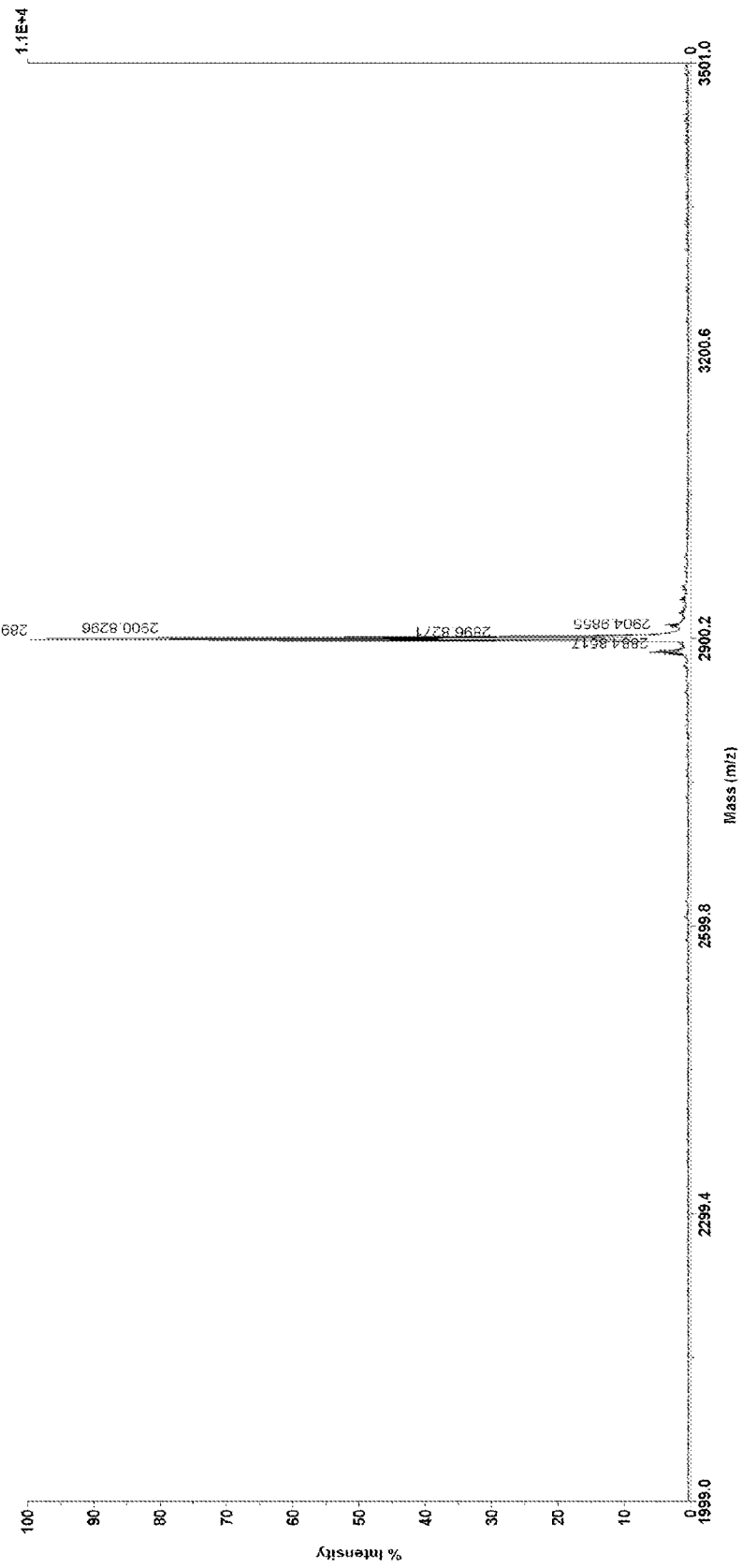
FIG. 8A is a MALDI-TOF result confirming synthesis of GD-1.
Figure 8B:
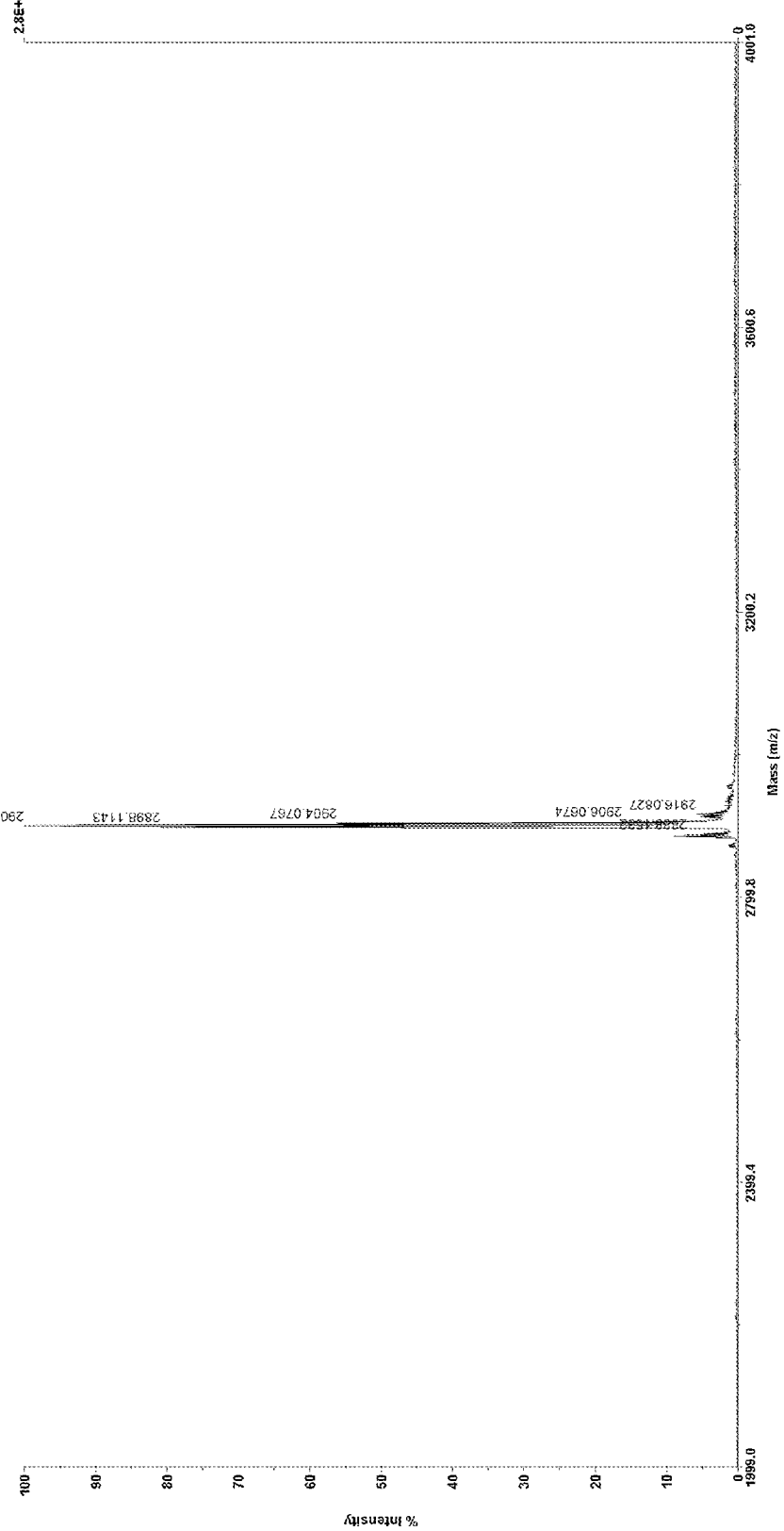
FIG. 8B is a MALDI-TOF result confirming synthesis of GD-2.
Figure 8C:
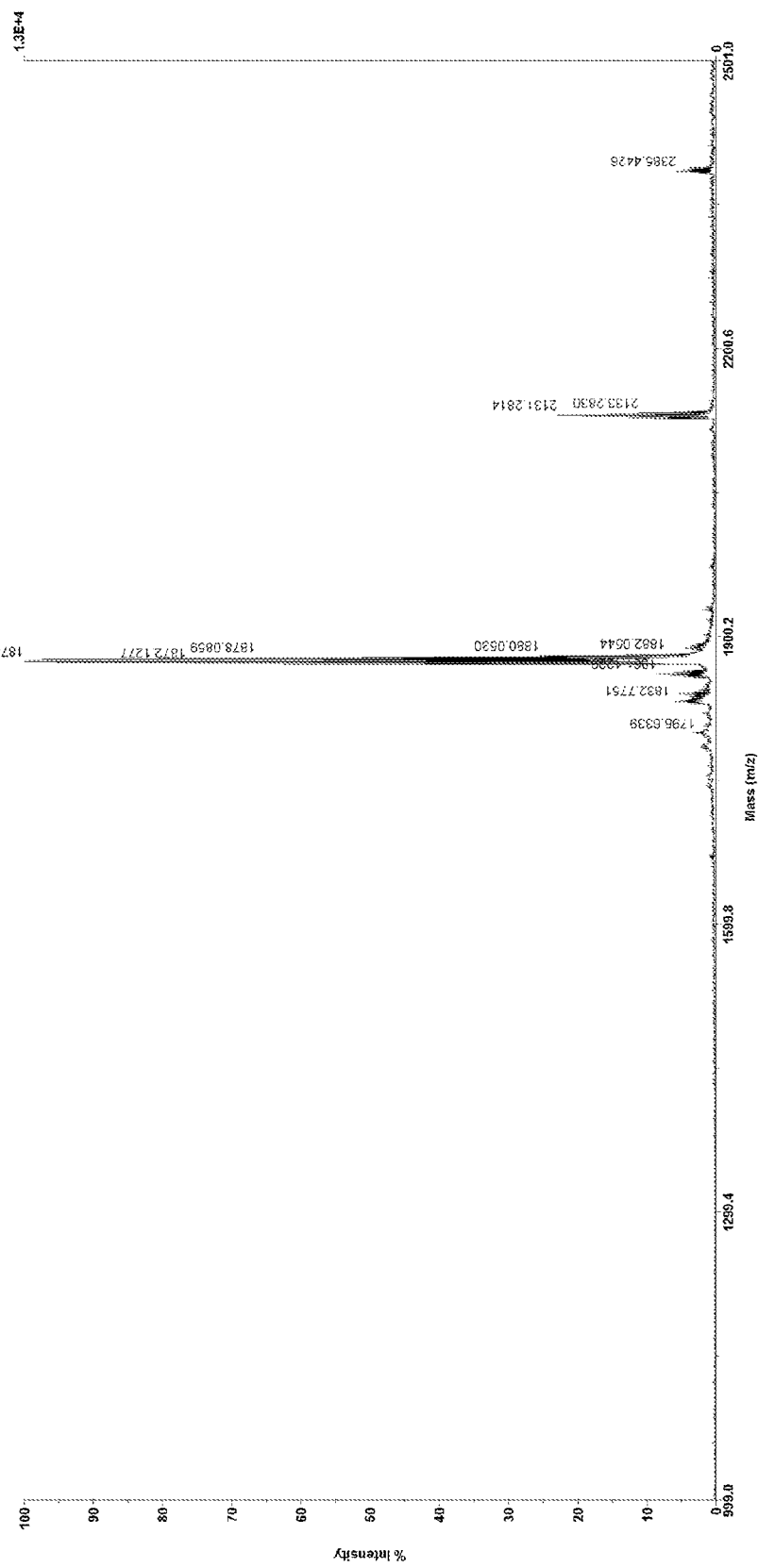
FIG. 8C is a MALDI-TOF result confirming synthesis of GD-3.
Figure 8D:
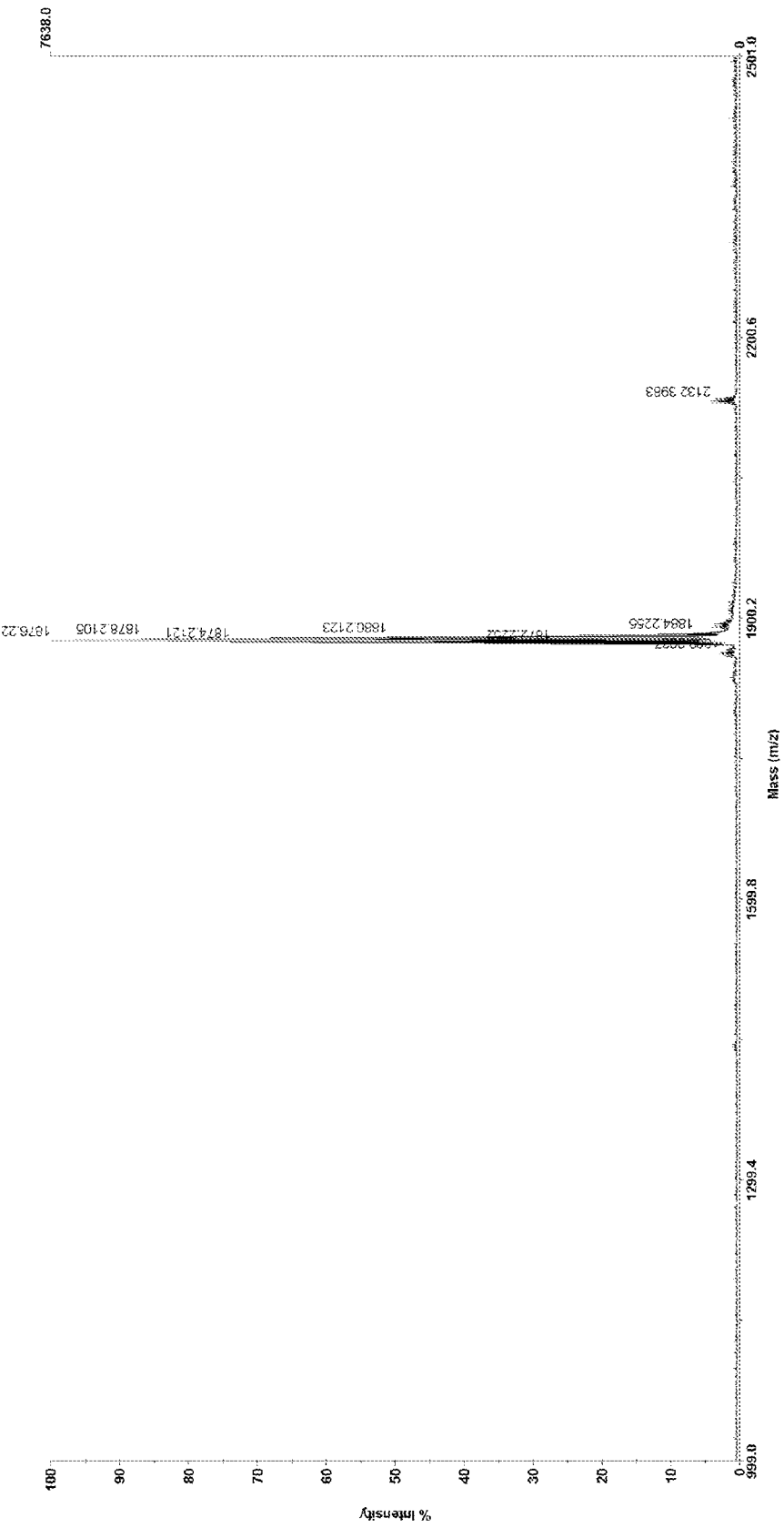
FIG. 8D is a MALDI-TOF result confirming synthesis of GD-4.
Figure 8E:
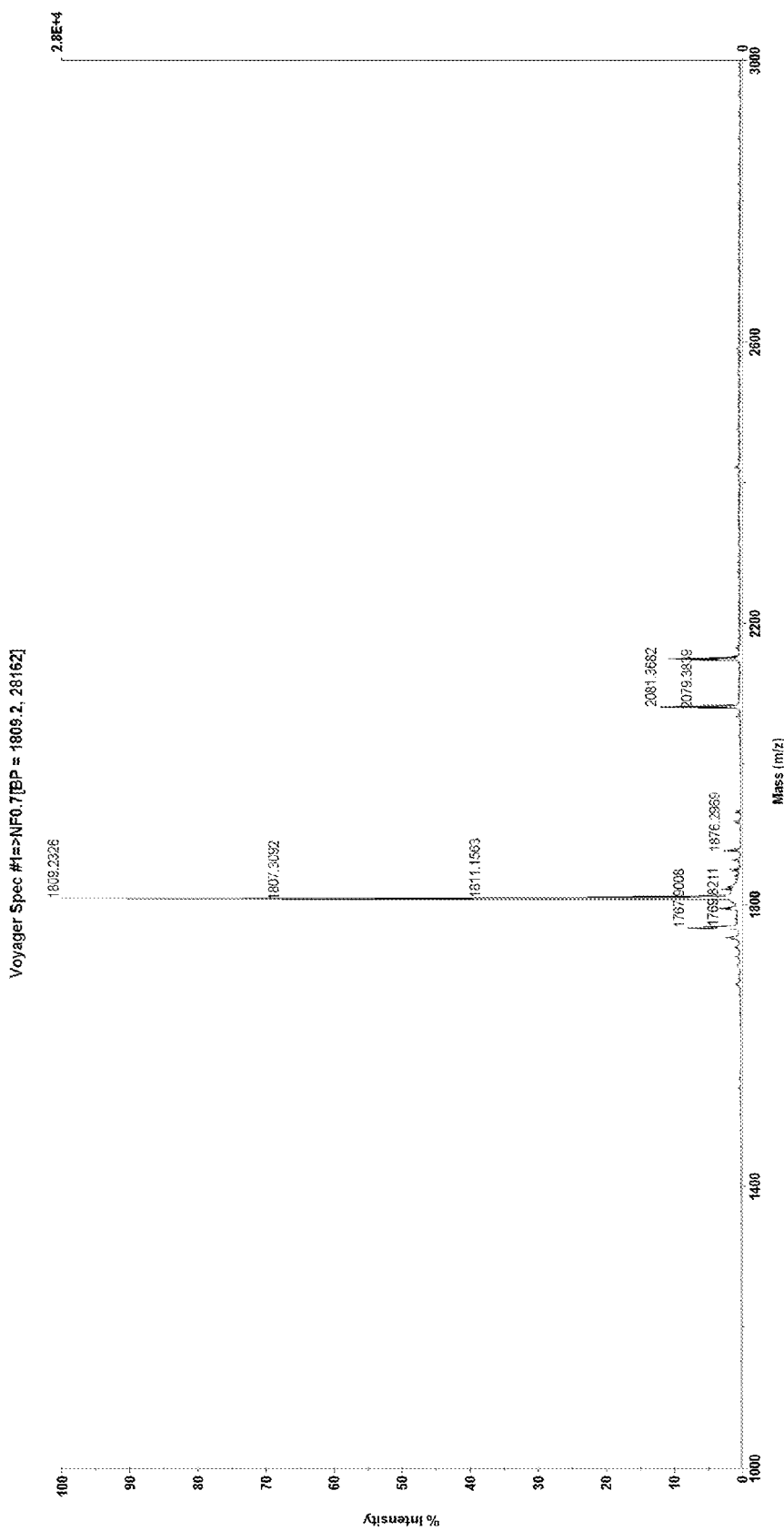
FIG. 8E is a MALDI-TOF result confirming synthesis of GD-5.
Figure 8F:
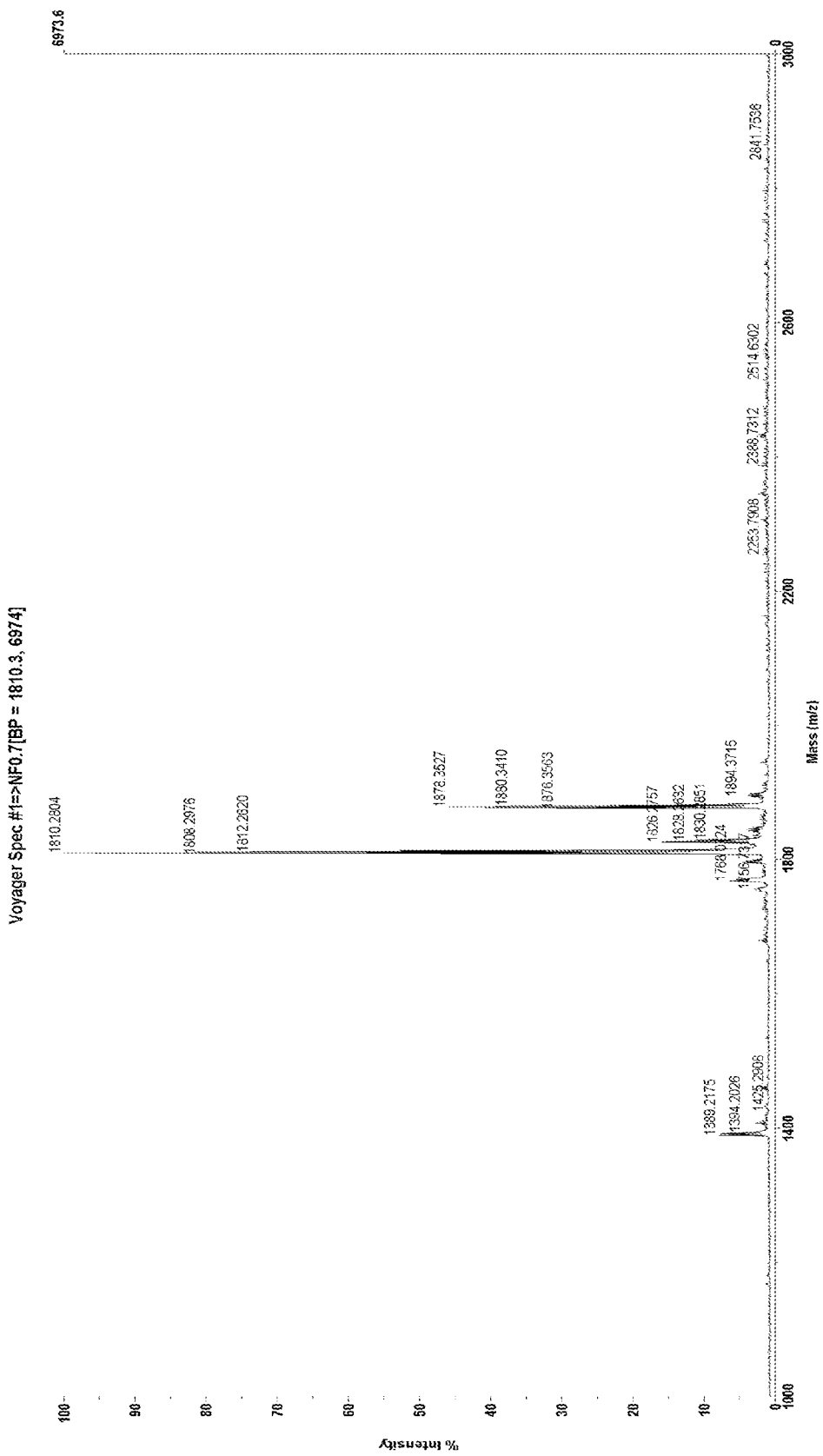
FIG. 8F is a MALDI-TOF result confirming synthesis of GD-6.
Figure 8G:
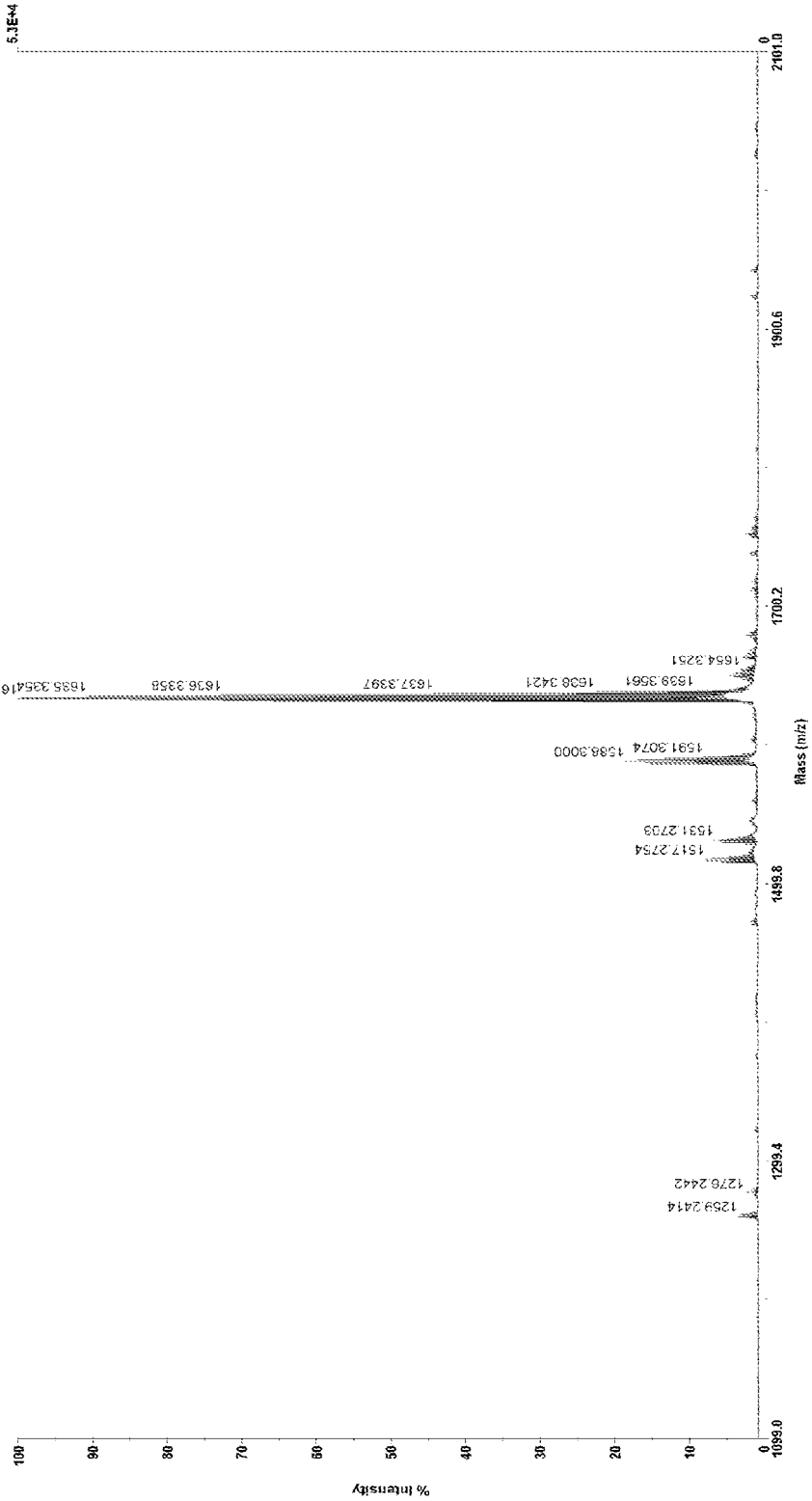
FIG. 8G is a MALDI-TOF result confirming synthesis of GD-7.
Figure 8H:
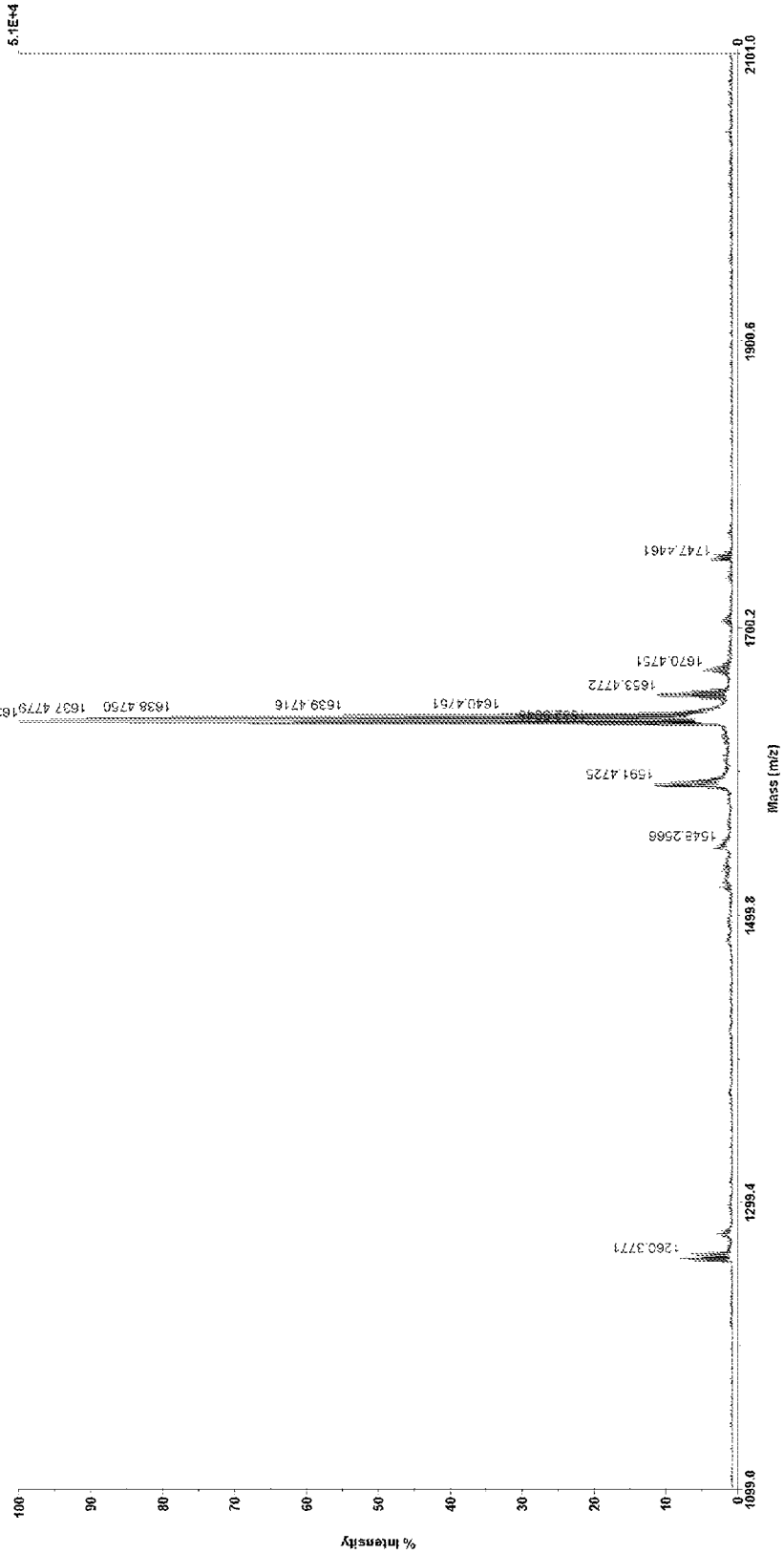
FIG. 8H is a MALDI-TOF result confirming synthesis of GD-8.
Figure 8I:
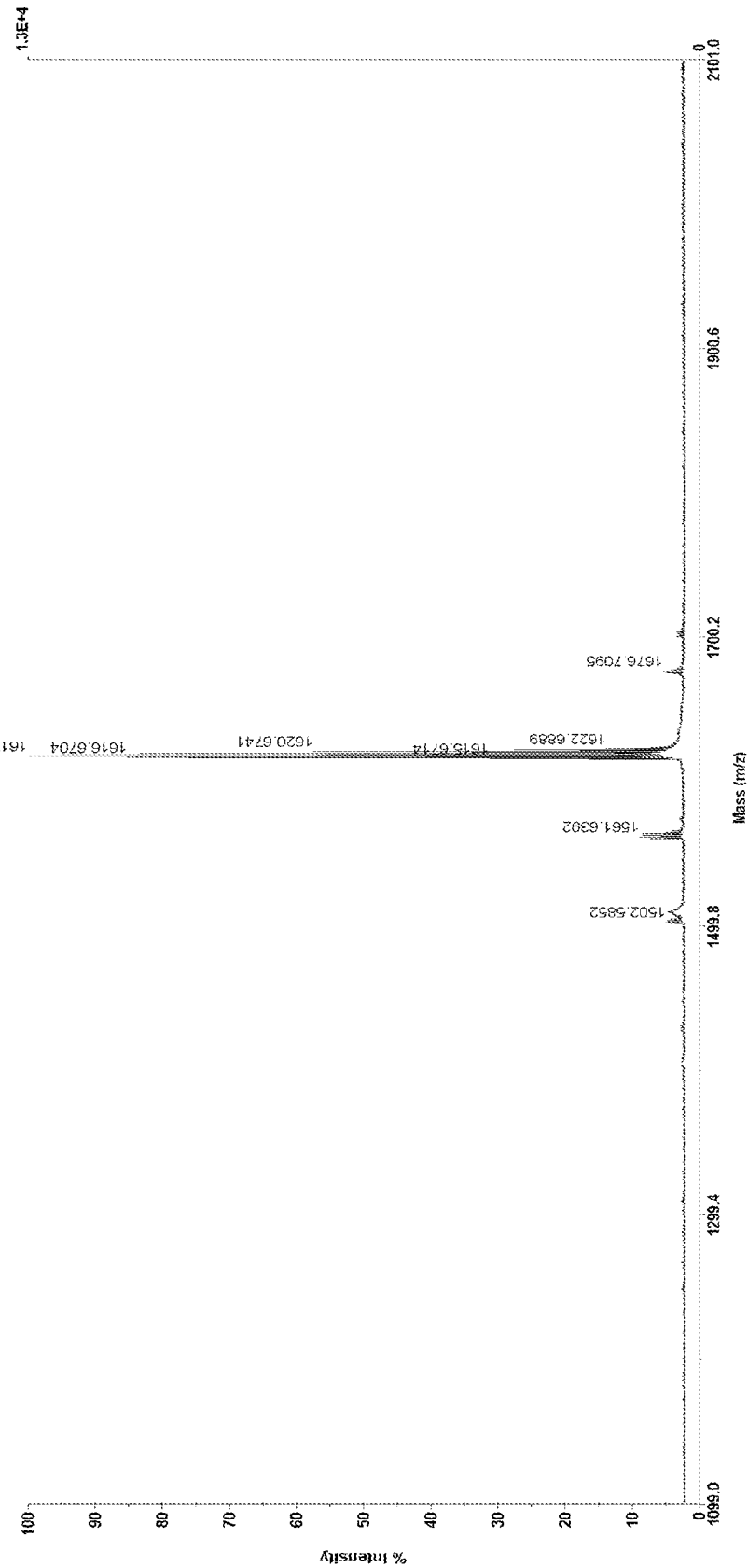
FIG. 8I is a MALDI-TOF result confirming synthesis of GD-9.

FIGS. 6M-6O are color mixing absorption, transmission spectrum, and coloring graphs of GD-4, which show correlation of absorption and transmission spectrum and color filter coating thickness depending on luminance in mixing color compared with G3.

As the present features may be embodied in several forms without departing from the characteristics thereof, it should also be understood that the above-described embodiments are not limited by any of the details of the foregoing description, unless otherwise specified, but rather should be construed broadly within its scope as defined in the appended claims, and therefore all changes and modifications that fall within the metes and bounds of the claims, or equivalents of such metes and bounds are therefore intended to be embraced by the appended claims.

What is claimed is:

1. A dye comprising a compound of Formula 1:

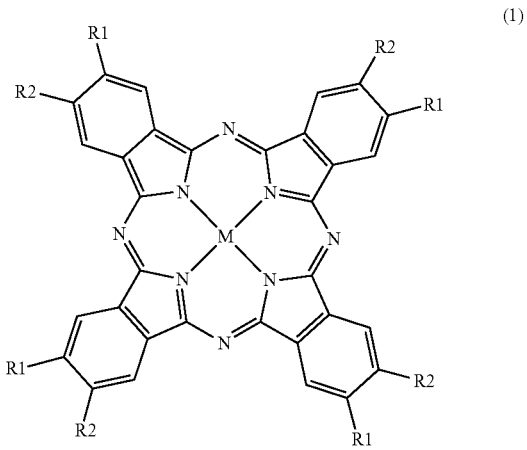

wherein M is Cu or Zn and
R1 or R2 is selected from a group consisting of halogen, unsubstituted or substituted alkyl ether, and unsubstituted or substituted aryl ether independently to the exclusion of the case that both R1 and R2 are halogen.

2. The dye according to claim 1, wherein the unsubstituted or substituted alkyl ether has more than 6 carbon atoms and the unsubstituted or substituted aryl ether has more than 6 carbon atoms.

3. The dye according to claim 1, wherein R1 or R2 is one selected from a group consisting of halogen,

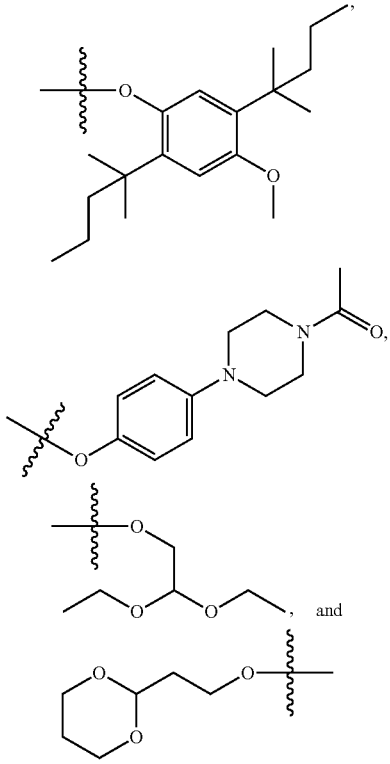

independently to the exclusion of the case that both R1 and R2 are halogen.

4. A dye comprising a compound of Formula (2):

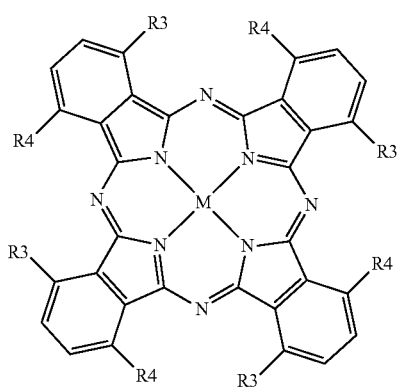

(2)

wherein M is Cu or Zn and
R3 or R4 is selected from a group consisting of hydrogen, unsubstituted or substituted alkyl ether, and unsubstituted or substituted aryl ether, independently to the exclusion of the case that both R3 and R4 are hydrogen.

5. The dye according to claim 4, wherein the unsubstituted or substituted alkyl ether has more than 6 carbon atoms and the unsubstituted or substituted aryl ether has more than 6 carbon atoms.

6. The dye according to claim 4, wherein R3 or R4 is one selected from a group consisting of hydrogen,

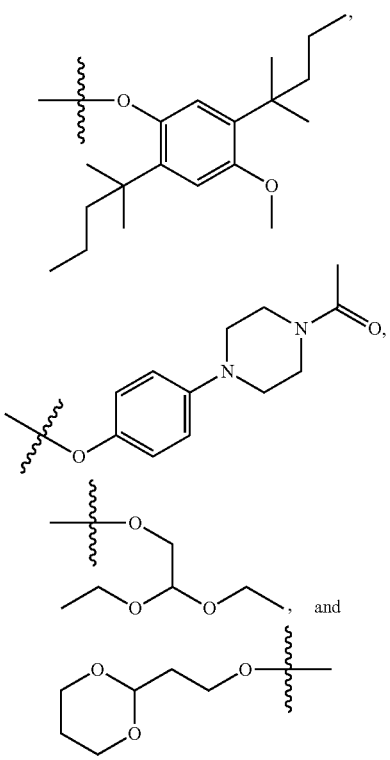

independently to the exclusion of the case that both R3 and R4 are hydrogen.

7. A dye dispersion comprising the dye of claim 1.
8. A coloring composition comprising the dye dispersion of claim 7.
9. A color filter formed by using the coloring composition of claim 8.
10. A dye dispersion comprising the dye of claim 4.
11. A coloring composition comprising the dye dispersion of claim 10.
12. A color filter formed by using the coloring composition of claim 11.
13. A method of preparing dye, comprising:
   preparing a phthalonitrile-induced precursor; and
   preparing the dye of Formula 1 using the phthalonitrile-induced precursor:

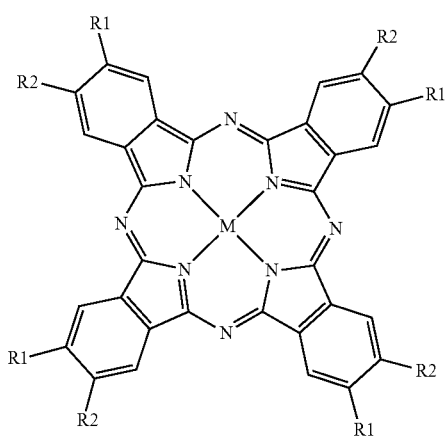

(1)

wherein M is Cu or Zn and
R1 or R2 is selected from a group consisting of halogen, unsubstituted or substituted alkyl ether, and unsubstituted or substituted aryl ether independently to the exclusion of the case that both R1 and R2 are halogen.

14. A method of preparing dye, comprising:
preparing a phthalonitrile-induced precursor; and
preparing the dye of Formula 2 using the phthalonitrile-induced precursor:

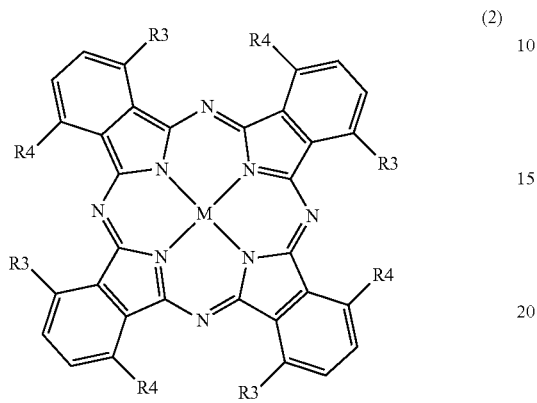

(2)

wherein M is Cu or Zn and
R3 or R4 is selected from a group consisting of hydrogen, unsubstituted or substituted alkyl ether, and =substituted or substituted aryl ether, independently to the exclusion of the case that both R3 and R4 are hydrogen.

* * * * *